United States Patent [19]
Cooper et al.

[11] Patent Number: 6,058,012
[45] Date of Patent: *May 2, 2000

[54] APPARATUS, METHOD AND SYSTEM FOR THERMAL MANAGEMENT OF AN ELECTRONIC SYSTEM HAVING SEMICONDUCTOR DEVICES

[75] Inventors: Patrick R. Cooper, Houston; William C. Hallowell, Spring; Mark S. Tracy, Tomball; Curtis Progl, Montgomary; Minh H. Nguyen, Houston, all of Tex.

[73] Assignee: Compaq Computer Corporation, Houston, Tex.

[ * ] Notice: This patent is subject to a terminal disclaimer.

[21] Appl. No.: 09/067,071

[22] Filed: Apr. 27, 1998

Related U.S. Application Data

[63] Continuation-in-part of application No. 09/054,735, Apr. 3, 1998, which is a continuation-in-part of application No. 08/703,342, Aug. 26, 1996, Pat. No. 5,737,187.

[51] Int. Cl.$^7$ ...................................................... H05K 7/20
[52] U.S. Cl. .......................... 361/704; 361/688; 361/689; 361/690; 361/694; 361/695; 361/698; 361/699; 361/700; 361/720; 165/80.3; 165/80.4; 174/16.1; 174/16.3; 174/15.2; 174/15.1; 395/556
[58] Field of Search ..................................... 361/688, 690, 361/694, 695, 697, 698, 699, 700, 704, 707, 715, 717–721; 165/80.2–80.4, 185; 174/15.1, 15.2, 16.1, 16.3; 257/717–719; 395/556

[56] References Cited

U.S. PATENT DOCUMENTS

| | | | |
|---|---|---|---|
| 5,287,292 | 2/1994 | Kenny et al. | 395/556 |
| 5,467,607 | 11/1995 | Harvey | 165/80.3 |
| 5,502,838 | 3/1996 | Kikinis | 395/556 |
| 5,569,950 | 10/1996 | Lewis et al. | 361/718 |
| 5,582,235 | 12/1996 | Hamilton et al. | 165/80.3 |
| 5,740,016 | 4/1998 | Dhindsa | 361/704 |
| 5,752,011 | 5/1998 | Thomas et al. | 395/556 |

*Primary Examiner*—Leo P. Picard
*Assistant Examiner*—Boris L. Chervinsky
*Attorney, Agent, or Firm*—Frohwitter; Paul N. Katz

[57] ABSTRACT

A thermal management controller to regulate the operating temperature of high speed, high circuit density semiconductor dice in an electronic product. The thermal management controller monitors the temperature of a heat sink in thermal contact with the high speed, high circuit density semiconductor dice and also monitors the operational status of one or more specified devices which may increase the heat load within the electronic product. As the temperature of the heat sink increases and/or as specified devices increase the heat load in the electronic product, the thermal management controller will start cooling fans and/or increases the speed of the cooling fans to increase heat removal from the electronic product by forced convection. As the temperature of the heat sink decreases and/or as specified devices cease contributing to the heat load in the electronic product, the thermal management controller will decrease the speed of the cooling fans and/or turn off the cooling fans to decrease heat removal from the electronic product. If the temperature of the heat sink rises above a predetermined temperature, the thermal management structure will reduce the clock speed of the semiconductor dice. If the temperature of the heat sink rises above a predetermined maximum temperature, the thermal management structure will turn of the semiconductor dice.

35 Claims, 19 Drawing Sheets

APPARATUS, METHOD AND SYSTEM FOR THERMAL MANAGEMENT OF AN ELECTRONIC SYSTEM HAVING SEMICONDUCTOR DEVICES

CROSS REFERENCE TO RELATED PATENT APPLICATION

This patent application is a continuation-in-part of U.S. patent application Ser. No. 09/054,735, filed Apr. 3, 1998, 1998, entitled "Apparatus, Method and System for Thermal Management of a Semiconductor Device" by Mark S. Tracy, Curtis Progl and Minh H. Nguyen, and is incorporated by reference herein, which is a continuation-in-part of U.S. patent application Ser. No. 08/703,342, filed Aug. 26, 1996, now U.S. Pat. No. 5,737,187, issued on Apr. 7, 1998, entitled "Apparatus, Method and System for Thermal Management of an Unpackaged Semiconductor Device," by Minh H. Nguyen and Mark S. Tracy, and is incorporated by reference herein.

BACKGROUND OF THE INVENTION

1. Field of the Invention

The present invention relates generally to an apparatus, method and system for thermal management of an electronic system having semiconductor devices, and, more particularly, to an apparatus, method and system for mechanical isolation combined with removal and dissipation of heat generated by a high clock frequency, high circuit density semiconductor devices.

2. Description of the Related Technology

Ever increasing market pressure for smaller, faster, and more sophisticated electronic products using integrated circuits has driven the electronics industry to develop integrated circuits which occupy less volume yet operate at heretofore unheard of clock frequencies employing incredible circuit densities. For example, two current production integrated circuits which serve as microprocessors are manufactured by the Intel Corporation called the PENTIUM (PENTIUM is the registered trademark of the Intel Corporation) and the PENTIUM II (PENTIUM II is the registered trademark of the Intel Corporation). The PENTIUM has over 3 million circuits in a single semiconductor die using 0.6 to 0.35 micron technology, operates at speeds ranging up to 266 MHz. The PENTIUM II has over 10 million circuits in a single semiconductor die and operates at speeds ranging up to 400 MHz, and is projected to soon exceed 500 MHz.

Because of the fragility of integrated circuit dice, and their susceptibility to environmental influences and mechanical trauma, individual or multiple integrated circuit dice have traditionally been enclosed in a protective "package" such as Pin Grid Array ("PGA") or Ball Grid Array ("BGA"). These packages may be made of plastic or ceramic materials, and provide electrical leads so that the enclosed die (or dice) may be electrically connected to a substrate, such as a printed circuit board ("PCB").

As the electronic products which utilize these increasingly powerful integrated circuits continue to shrink in size, such as laptop computers and other consumer, commercial, and military electronics, the space available for mounting the packaged integrated circuit die (or dice) is also reduced. Unfortunately, as integrated circuits grow in complexity and circuit density, the number of package leads needed to connect the packaged die (or dice) to the substrate also increases, thereby requiring more, not less, area to provide reliable electrical interconnections between the surface mount package to the substrate. Further, as the number of package leads increases, so does the capacitance, inductance and resistance of the package leads, which can degrade signal fidelity to and from the die (or dice).

In an effort to eliminate the above problems associated with modern packaging, some integrated circuit manufacturers have eliminated packages, and placed the unpackaged integrated circuit die (or dice) directly on the substrate. This practice of connecting unpackaged die (or dice) directly on a substrate is generically referred to as "chip-on-board" packaging.

An example of chip-on-board technology which is currently being manufactured and sold is the Intel Corporation's TCP PENTIUM®. The TCP PENTIUM ("TCP" stands for Tape Carrier Packaging) is a version of the PENTIUM in which the microprocessor integrated circuit die is an unpackaged die mounted face up on a PCB substrate and electrically connected to the PCB substrate using tape automated bonding technology. The PCB substrate also has numerous other integrated circuit packages directly connected to the substrate. When multiple dice are mounted on the same substrate, whether some or all are packaged or unpackaged, the combination is usually referred to as a multi chip module ("MCM").

Chip-on-board die leads may be electrically connected to the substrate face down using solder ball bonding (also known as "flip-chip") or in either a face down or face up arrangement using tape automated bonding ("TAB"). The exposed face of the die (i.e. the face opposite the face directly connected to the substrate) may be covered with a mechanically protective encapsulent.

The move to unpackaged chip-on-board technology has overcome some of the problems associated with higher clock speeds and circuit densities, but as is often the case, a successful solution to one problem often creates one or more new problems which must be addressed. One problem with unpackaged dice is that although advances in passivation allow unpackaged dice to withstand normal environmental influences better, unpackaged dice are still fragile and easily damaged by very minor external mechanical trauma, whether or not the dice are topped with an encapsulent. Although traditional component boards and MCM's (i.e. those having only packaged dice) have always been regarded and treated as delicate, this has usually been due to the risk of static electric discharge during handling which could damage the integrated circuits, not the mere accidental touching of a packaged die on a substrate board. An unpackaged die (or dice) with an encapsulent cap generally should not be subjected to more than 4.5 kilograms (9.9 pounds) of force on the center of the exposed face, however, lower forces may be damaging depending on the specific design parameters of a given die (or dice). A human hand in the mere act of touching an object, typically can and will exert forces greater than 4.5 kilograms.

Component boards and MCM's are usually fabricated at one location and then transported to either a component assembly location of either the original equipment manufacturer or a third party assembler. Sometimes, the component boards and/or MCM's are sold directly to end users who either need to repair or upgrade existing electronic products. This presents component manufacturers with the dilemma of shipping factory tested known good boards and MCM's having unpackaged dies, only to experience a higher than acceptable mortality rate in the course of normal shipping, and more often than not, normal handling by third party assemblers or end users.

Another problem with an unpackaged die (or dice) is related to the dissipation of waste heat generated by the die (or dice), also known as thermal management. As clock frequency and circuit density increase and die size decreases, the die power density and resulting production of waste heat also increase. As the quantity of waste heat increases, the effective steady state operating temperature of the die may also increase. If the steady state operating temperature of the die becomes greater than the maximum functional operating temperature of the die, the integrated circuit die may suffer degraded performance and/or experience logic errors. If the steady state operating temperature of the die becomes high enough, the die may experience errors in clock timing potentially causing the chip and/or system to lock-up. If the temperature becomes extremely high, the die may become permanently damaged and fail.

In addition to thermal performance degradation and/or damage, another problem of chip-on-board technology associated with increased waste heat is caused by the differences in the thermal coefficients of expansion ("TCE") between the die and the substrate, commonly referred to as TCE mismatch. Integrated circuit dice are composed of silicon whereas most substrates are composed of organic materials. The TCE of organic substrates are much greater than the TCE of silicon dice, therefore as temperature increases the organic substrates expand more than the silicon dice. Further, in a powered state, unpackaged dice conductively transfer most of their generated waste heat to the substrate. Therefore when an electronic product containing a chip-on-board die is turned on, the die temperature rises from the ambient temperature to the steady state operating temperature, which also raises the temperature of the organic substrate. Because of the TCE mismatch, the substrate expands more than the chip-on-board die. This condition results in a large mechanical stress being placed on the mechanically fragile die and the electrical connections to the substrate. Repeated power cycling can result in mechanical fatigue and eventual failure of die or the electrical connections, thereby destroying the use and/or value of the electronic product.

The present accepted solution for thermal management and TCE mismatch of unpackaged dice is to use the substrate, with or without thermal vias at the die attachment site, as a heat sink wherein the waste heat generated by the unpackaged die (or dice) is conductively transferred from the die to the substrate where the heat is both conductively transferred away from the die in the substrate and also convectively and radiantly transferred from the substrate to the ambient environment. If additional thermal enhancements are required, such as an externally attached heat sink, the heat sink is attached to the side of the substrate opposite the side where the unpackaged die is mounted. If an external heat sink is attached to the substrate, this provides an additional conductive path to transfer heat away from the die to the substrate, and then on to the external heat sink, where the heat is radiantly and convectively transferred to the ambient environment. Unfortunately, with the current trend of increasing power densities and consequent increasing waste heat generation of unpackaged die (or dice), these thermal management techniques are limited at best and more likely unacceptably inadequate.

Another problem associated with increasing clock speeds of semiconductor devices is that of radio frequency interference ("RFI"), also known as electromagnetic interference ("EMI"). Current production semiconductor dice are operating at speeds which are the same as radio frequencies used in wireless communications. For example, United States television channel 13 operates at approximately the 210 MHz frequency, while at the other end of the spectrum analog cellular telephones both receive and transmit at frequencies centered at approximately 880 MHz. Further, semiconductor devices can both emanate (transmit) and intercept (receive) electromagnetic fields at the operating (fundamental) frequency of the semiconductor device, as well as, at other (harmonic) frequencies greater than the operating frequency. Both emanation and interception of electromagnetic fields is often undesirable. Emanation of undesired electromagnetic fields can interfere with proper operation of nearby electrical devices or radio signal reception/transmission, whereas interception of strong radio signal transmissions (such as from a nearby cellular phone) could possibly cause a semiconductor device to malfunction and produce erroneous output. Additionally, the Federal Communications Commission ("FCC") has issued regulations which require that semiconductor devices and electronic systems not emanate radio frequencies above certain very low power levels (Part 15 of FCC Rules).

Another problem associated with the increasing clock speeds of semiconductor devices which cause more power dissipation in these devices is that of reduced battery life and increased noise due to the increased use of electric powered cooling fans. As more heat is generated by the semiconductor devices inside of an electronic product case, passive convective air flow through the case becomes insufficient to dissipate this heat. When passive convective air flow is not sufficient, one or more electric powered cooling fans must be used to provide active convective air flow through the electronic product case to adequately remove the increased heat loads being generated.

One solution to removing the increased heat loads is to continuously operate a cooling fan whenever the electronic product, such as a computer, is on. When the electronic product is operating off of an external power source, such as an AC wall outlet, the continuous operation of the fan presents the problem of the continuous semi-audible drone of the fan which can annoy an operator. When the electronic product is operating from an internal power source, such as a battery, the continuous operation of the fan presents the additional problem of reduced battery charge life due to the continuous power draw by the fan.

A solution to extend the battery charge life is to reduce the cooling fan power draw by intermittently operating the cooling fan, that is to say, by periodically turning the fan on and off by use of a timer and/or a thermostat located inside the case. This solution, however, suffers from two drawbacks. First, the constant cycling of the fan between the off state to the 100 percent on state can produce large temperature swings in or near the semiconductor devices. Second, the constant cycling of the fan is more annoying to the human operator because of the sudden source of a semi-audible sound when the fan is turned on as well as the sudden absence of this same background semi-audible sound when the fan is turned off.

What is needed is an apparatus, method and system to provide the necessary thermal management of high power density packaged or unpackaged dice during normal operation, which minimizes both emanation and interception of electromagnetic fields by packaged or unpackaged high frequency dice, and which also protects unpackaged dice from mechanical trauma during normal transportation, handling, installation, and operation, and which further extends battery charge life while minimizing any semi-audible sounds produced by the cooling fan during normal operations as well as when the fan is energized or de-energized.

SUMMARY OF THE INVENTION
Disclosure of the Invention

According to the present invention a thermal management structure sandwiches both sides of a chip-on-board substrate. The thermal management structure provides an unpackaged die (or dice) and any packaged die (or dice) on the chip-on-board substrate with both a mechanical protective cover and maximum conductive heat transfer interface contacts to a heat sink mass. In an aspect of the invention, the thermal management structure also shields (isolates) the chip-on-board substrate from the electromagnetic environment external to the thermal management device. In another aspect of the invention, a thermal management controller variably adjusts the speed of one or more cooling fans, as well as the clock speed of the one or more dice in the thermal management structure, in response to the temperature of the thermal management structure and the operation of other heat producing devices in an electronic product.

The mechanical protective cover aspect of the invention allows the chip-on-board substrate to be shipped, handled, installed, and operated with minimal risk of the unpackaged die or dice, as well as any packaged dice, being physically damaged by an accidentally touching with a human hand, tool, shipping carton, electronic product component or other foreign object. The maximum conductive heat transfer interface aspect of the invention allows a heat sink mass to be compliantly thermally engaged to both the side of the substrate opposite the side where the packaged or unpackaged die is mounted (hereinafter "board side") as well as to the fragile exposed face of the die, whether or not the die has an encapsulent top (hereinafter "exposed face").

By providing the maximum conductive heat transfer interface with both the exposed face of the packaged or unpackaged die and the board side of the substrate, the thermal gradient across the die and the substrate immediately attached to the die is reduced, thereby reducing the ultimate steady state operating temperature of the die and the substrate for a given ambient temperature. By reducing the ultimate steady state operating temperature, the likelihood of thermal performance degradation, damage, or TCE mismatch induced failure of the packaged or unpackaged die is considerably reduced.

According to another aspect of the invention, the thermal management structure comprises a heat sink mass having a first heat sink piece and a second heat sink piece. Both heat sink pieces have corresponding offsetting mounting brackets (or tabs) which align with mounting sites in the chip-on-board substrate. The offsetting mounting brackets serve to align and fixedly attach the first and second heat sink pieces with the chip-on-board substrate in a predetermined configuration. The offsetting mounting brackets further act as spacers which define and maintain a predetermined minimum distance between an inside face of the respective heat sink piece with the corresponding side of the chip-on-board substrate and any packaged or unpackaged chips thereon.

Mechanically compliant and thermally conductive interface pads are interposed between the inside face of the respective heat sink piece and selected locations on either the packaged or unpackaged die exposed face or the substrate board side. Each interface pad has a predetermined thickness which corresponds to the distance between the inside face of the respective heat sink piece with the corresponding selected location on the die exposed face or the substrate board side between which the interface pad is interposed. For any selected location, by judiciously selecting the tolerances and allowances of the interface pad thickness and the offset of the mounting brackets, the interface pad will compliantly conform to surfaces of both the inside face of the heat sink piece and the selected locations on either the die exposed face or the substrate board side. This will allow maximum conductive thermal interface contact between the substrate or die exposed face with the heat sink piece while subjecting the selected location to minimum mechanical loading forces.

According to another aspect of the invention, one of the two heat sink pieces may have a lip which is shaped and sized to both encircle the edges of the substrate and electromagneticly seal against the inside surface of the other heat sink piece thereby providing an electromagnetic shield around the substrate. The lip may be fabricated to closely contour one or more edges of the substrate to further assist in the alignment of the substrate in a predetermined configuration with the one heat sink piece and its mounting brackets. The lip further acts as a spacer which defines and maintains a predetermined minimum distance between the inside faces of the two heat sink pieces.

According to another aspect of the invention, the first and second heat sink pieces may be shaped and sized to provide heat removal from the chip-on-board substrate via conduction to distant points in the heat sink, and by convection and radiation from the heat sink to the ambient environment, while conforming to the space available in the electronic product to install the chip-on-board substrate. Either or both of the first and second heat sink pieces may have projections which extend, and/or project out of, the main plane of the heat sink piece to enhance conductive heat removal to distant points. Either or both of the heat sink pieces may have extended surfaces, such as pins, fins or the like which increase the surface area to mass ratio of the heat sink piece to enhance passive or forced convective heat removal to the ambient environment. Further, either or both of the heat sink pieces may have heat pipe receptacles for holding heat pipes. The heat pipe receptacles may extend, and/or project out of, the main plane of the heat sink piece to enhance heat removal to distant points, or may be placed near the substrate to more evenly distribute waste heat across the heat sink piece.

According to another aspect of the invention, the thermal management structure may be used with a substrate assembly of two substrates arranged and interconnected as parallel planes (or bi-planar) which operate as a single unit.

According to another aspect of the invention, the thermal management structure may be used with a substrate or substrate assembly which has been enclosed in a thin walled enclosure.

According to another aspect of the invention, either or both of the first and second heat sink pieces may be designed to further compliantly and/or fixedly thermally engage other components in the electronic product capable of acting as heat spreaders to further conductively remove heat away from both the heat sink and the chip-on-board substrate. Such heat spreaders may be chassis or case components of the electronic product, for example a portable computer keyboard assembly, chassis, frame or case.

In another embodiment of the invention a thermal management controller monitors the temperature of the thermal management structure and the status of one or more specified devices located in an electronic product. Some specified devices may generate waste heat during normal operation and may include, by way of example and not limitation, an AC to DC power supply/battery charger, a CD-ROM drive, a hard disk drive, a removable disk drive, a PCMCIA card or the like. Other specified devices may signal the reduction of passive and/or active convective heat dissipation because some of the ventilation openings on an electronic product case have been closed. By way of example and not limitation, one or more vent holes near a keyboard on a "clam shell" laptop computer are covered when the monitor/lid is closed and latched to the base of the laptop computer thereby preventing the free flow of air through the vent holes near the keyboard.

Using the thermal management structure's temperature and the operational status of the one or more specified devices, the thermal management controller dynamically and variably adjusts the speed of one or more cooling fans located in the electronic product. As the temperature of the thermal management structure increases and/or as specified devices increase the heat load in the electronic product, the thermal management controller increases the speed of the one or more cooling fans to increase heat removal from the electronic product by forced convection. Alternatively, as the temperature of the thermal management structure decreases and/or as specified devices cease contributing to the heat load in the electronic product, the thermal management controller decreases the speed of the one or more cooling fans to optimize heat removal from the electronic product by forced convection. Should the temperature fall below a minimum temperature, and none of the specified devices are in a status requiring forced convection cooling (i.e. heat removal), the thermal management controller will turn the one or more cooling fans off.

The thermal management controller, by variably controlling the speed of the one or more cooling fans, provides a much finer control of the fans. The one or more fans turn on gradually and turn off gradually thereby reducing the level of semi-audible sound produced by the fans and eliminating the sudden step change in the semi-audible sound produced by the fans when turned on or off. Further, the variable speed tends to stabilize at the minimum speed required to maintain the temperature of the thermal management structure at a near constant temperature.

Another aspect of the invention is where the one or more cooling fans are operating at maximum speed and the thermal management structure's temperature has continued to increase, the thermal management controller will start stepping down the clock speed or duty cycling the clock to simulate a reduced clock speed of the one or more packaged or unpackaged, high speed, high circuit density semiconductor dice contained in the thermal management structure, thereby reducing the waste heat produced by the one or more dice. Should the temperature of the thermal management structure continue to rise above a maximum temperature, the thermal management structure will turn off the semiconductor dice in the thermal management structure.

Another aspect of the invention is when the electronic product has been turned off by the human operator and the electronic product has been connected to an external AC power source to recharge one or more batteries within the electronic product, the thermal management controller will detect the change in status (i.e. from off to full power) of the AC to DC power supply/battery charger and will turn on the one or more cooling fans and operate the cooling fans at a predetermined speed to remove the heat generated by the power supply. When the batteries are fully charged and the AC to DC power supply/battery charger switches from a fast charge to a trickle or pulse charge, the thermal management controller will detect the change in status (i.e. from full power to minimum power) and turn the one or more cooling fans off.

The thermal management controller comprises a control bus, a temperature sensor in thermal contact with the thermal management structure, one or more specified devices, a hardware control processor, a thermal zone look up table, a digital pot, a variable output DC voltage power supply, and one or more variable speed fans.

The temperature sensor and the one or more specified devices are connected to, and output their respective status signals to the control bus. The hardware control processor receives these status signals from the control bus for processing.

Using the temperature value, the hardware control processor accesses a temperature zone look up table and reads the appropriate fan speed logic value and the clock speed value. The hardware control processor then determines the status of the one or more specified devices and adjusts the fan speed logic value by adding a predefined constant value to the fan speed logic value for each specified device which is increasing the head load of the electronic product. The hardware control processor then outputs the clock speed value and the resultant fan speed logic value to the control bus.

The clock speed value is received by the one or more semiconductor dice contained in the thermal management structure where the clock speed is adjusted if necessary. The fan speed logic value is received by the digital pot. The digital pot then sets the output voltage from variable DC output voltage power supply to the one or more variable speed fans.

Other and further advantages and novel features will be apparent from the following description of the presently preferred embodiments of the invention, given for the purpose of disclosure and taken in conjunction with the accompanying drawings.

DETAILED DESCRIPTION OF PREFERRED EMBODIMENTS

Figure 1:
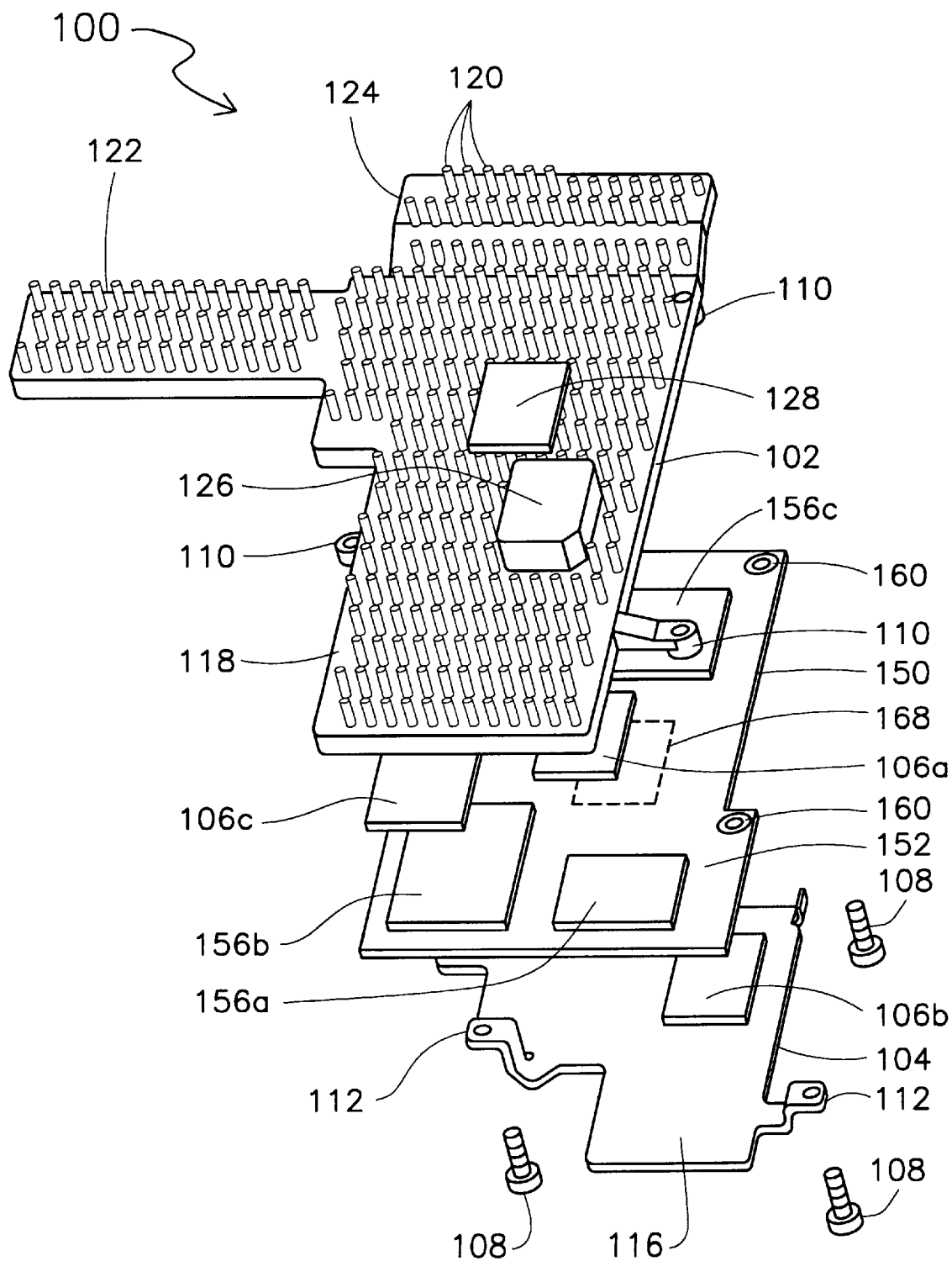
FIG. 1 is an exploded perspective view of an embodiment of the thermal management structure.

A better understanding of the present invention and the preferred embodiments will be obtained when the following detailed description is read with reference to the drawings. Like elements in the drawings are represented by like number, and similar elements are represented by like numbers with a different lower case letter suffix.

Figure 2:
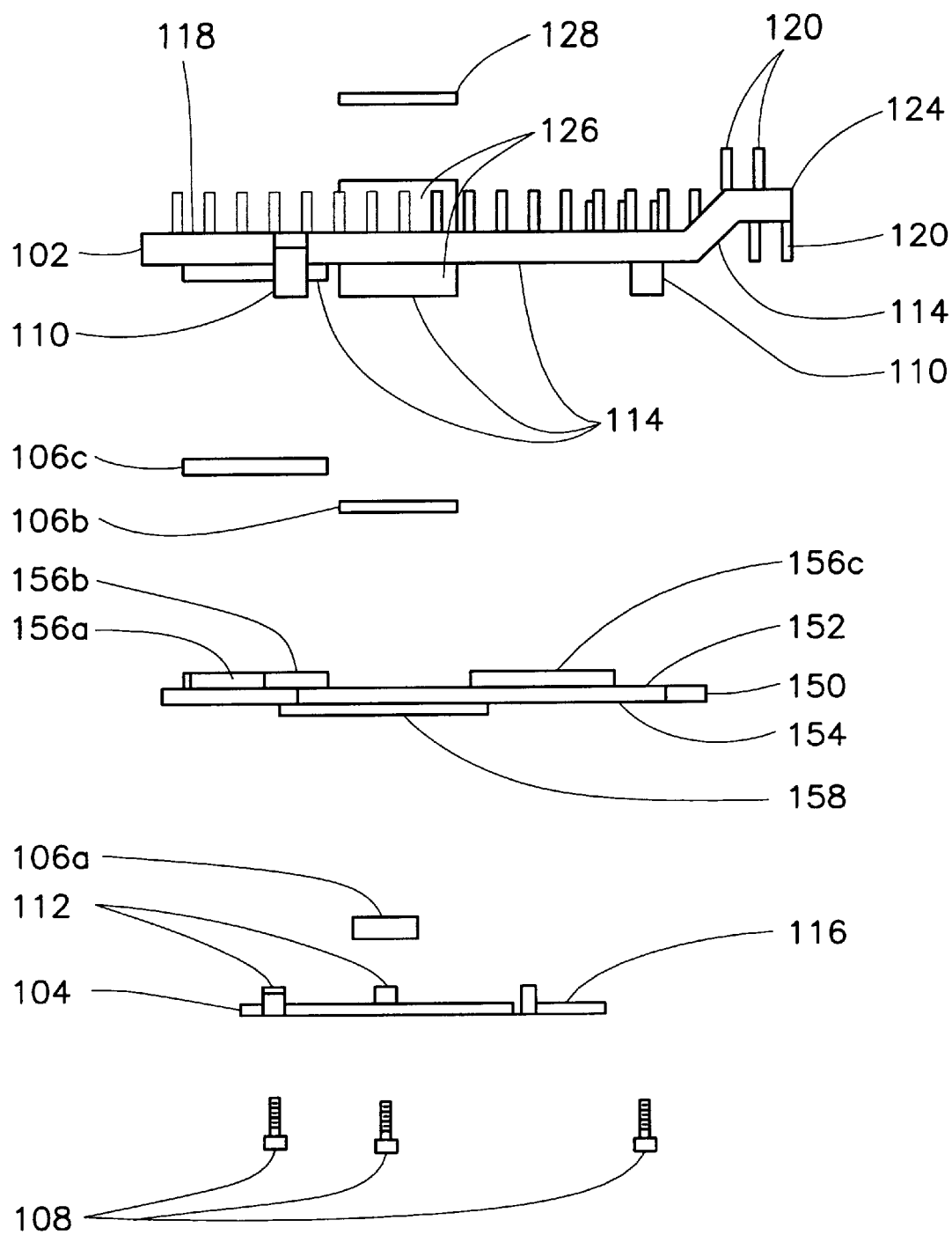
FIG. 2 is an exploded front elevation view of an embodiment of the thermal management structure.

Referring now to FIGS. 1 and 2, a thermal management structure 100 is illustrated in exploded perspective view and exploded front elevation view respectively. The thermal management structure 100 comprises four main parts: a first heat sink piece 102, a second heat sink piece 104, a plurality of thermal interface pads 106a, b and c, and a plurality of fasteners 108.

The thermal management structure 100 is in a thermal and mechanical functional cooperation with a chip-on-board substrate 150. The chip-on-board substrate 150 has a first side 152 and a second side 154, a plurality of packaged dice 156a, b and c, an unpackaged die 158 (best viewed in FIG. 2), and a plurality of mounting sites 160 (best viewed in FIG. 1). For the purpose of illustrative clarity, and not limitation, the plurality of mounting sites 160 are illustrated as holes, however, it is contemplated and with in the spirit of the present invention that some or all of the mounting sites may be holes, slots, grooves, pins or the like.

For the purpose of illustrative clarity, and not limitation, the plurality of packaged dice 156a, b and c are mounted on the first side 152 of substrate 150 and the unpackaged die 158 is mounted on the second side 154 of substrate 150 (best viewed in FIG. 2). The selection, number and relative positioning of unpackaged and packaged dice on a given substrate is outside the scope of the present invention. It is contemplated, however, and within the scope of the present invention, that the thermal management structure 100 may be adapted to functionally cooperate with a wide variety of unpackaged and packaged dice mounted on either or both sides of a substrate.

Sites on the chip-on-board substrate 150 are selected which have sufficient waste heat generation so as to require thermal enhancement to remove the waste heat. It is contemplated and within the scope of the present invention, that a chip-on-board substrate may have only one site or a plurality of sites which may require thermal enhancement to remove generated waste heat. For the purpose of illustration, and not limitation, it should be assumed that the packaged die 156b and the unpackaged die 158 both generate sufficient waste heat and require thermal enhancement, whereas packaged dice 156a and c have minimal waste heat generation and do not require thermal enhancement.

Figure 2A:
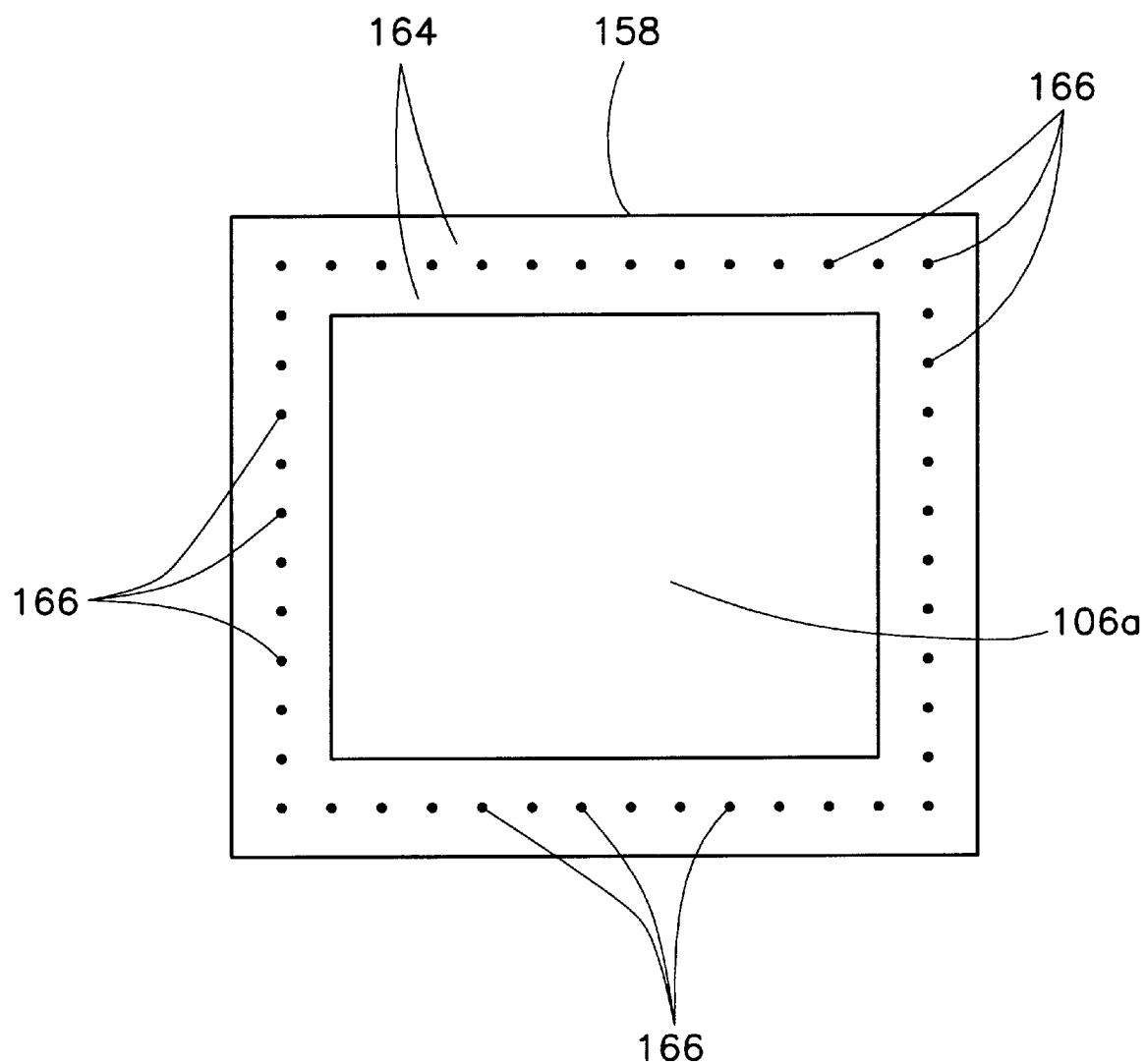
FIG. 2a is an bottom plan view of an aspect of an unpackaged die and an interface pad.
Figure 3:
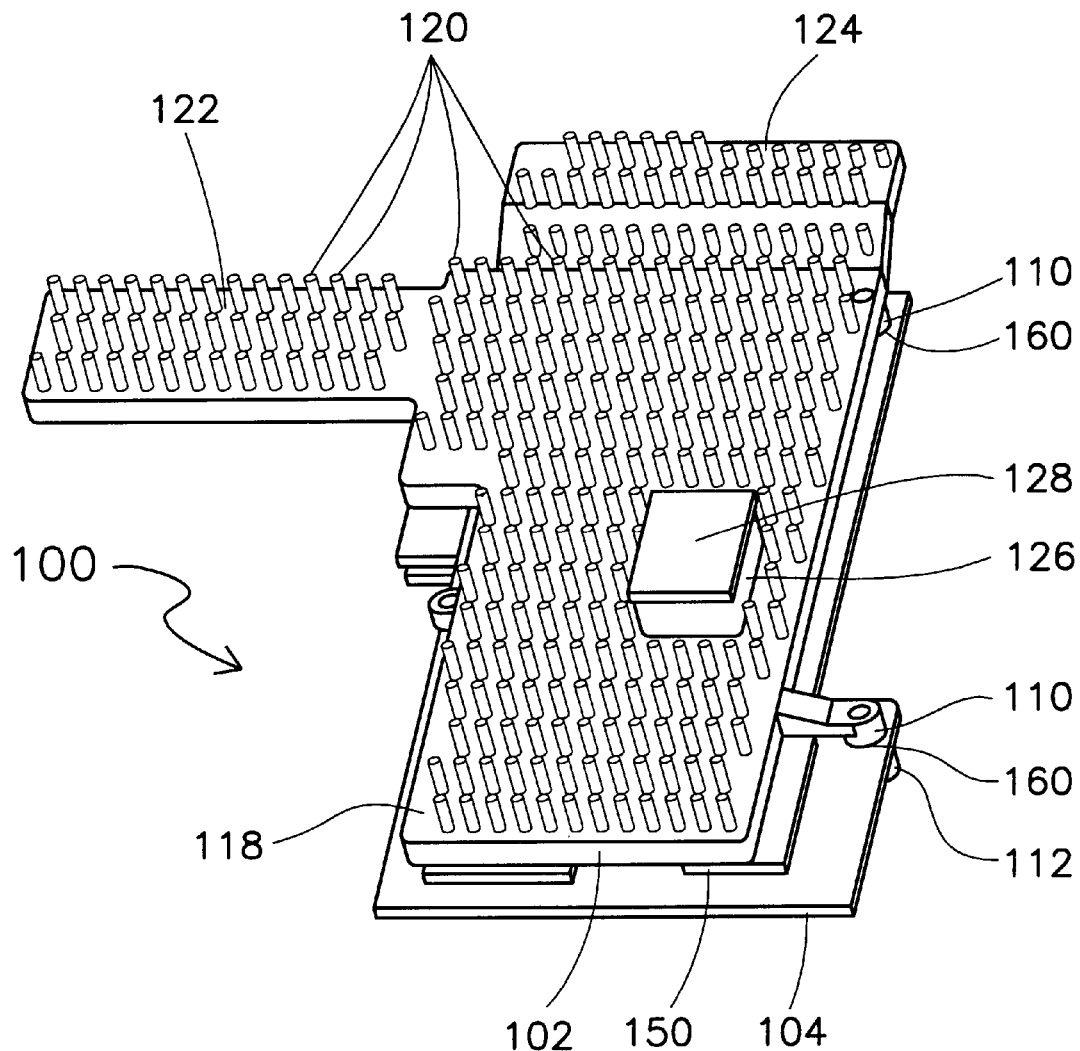
FIG. 3 is a perspective view of an embodiment of the thermal management structure.

Thermal interface pads 106a, b and c are selected and sized to engage the selected sites on the chip-on-board substrate 150 requiring thermal enhancement. Preferably the length and breadth of the thermal interface pads will be equal to or less than the corresponding length and breadth of the selected sites. If a selected site is an exposed face of a face up unpackaged chip, care should be exercised to not directly overlay or mechanically load the bond pads or electrical interconnections which typically are disposed along the outer periphery of the die, whether or not the exposed face is encapsulated. As best illustrated in FIG. 2a, a bottom plan view of the unpackaged die 158 is illustrated. Here unpackaged die 158 is in a face up configuration. The exposed face 164 has a plurality of bond pad locations 166 which are near the periphery of die 158. The interface pad 106a is centrally located and disposed on the exposed face 164 so that the interface pad 106a does not overlay or mechanically load the plurality of bond pad locations 166.

The interface pads 106a, b and c, are a mechanically compliant and thermally conductive material. Preferably the interface pads 106a, b and c are aluminum oxide filled silicone elastomer pads. It is contemplated and within the scope of the present invention, however, the interface pads 106a, b and c may be a thermally conductive grease, thermally conductive wax, thermally conductive elastomeric pad or the like, provided the interface pad is mechanically compliant and thermally conductive.

Referring again to FIGS. 1 and 2, the interface pads 106a, b, and c are interposed between the selected sites on the chip-on-board substrate 150 and either a first inside face 114 of the first heat sink piece 102 or a second inside face 116 of the second heat sink piece 104. Interface pad 106a is interposed between the exposed face 164 of unpackaged die 158 and the second inside face 116 of the second heat sink piece 104. Interface pad 106b is interposed between the "board side" of the unpackaged die 158 (i.e. the side of substrate 150 immediately opposite the side where the unpackaged die 158 is mounted), represented by the dotted line 168 in FIG. 1, and the first inside face 114 of the first heat sink piece 102. Interface pad 106c is interposed between the packaged die 156b and the first inside face 114 of the first heat sink piece 102.

The first and second heat sink pieces 102 and 104 preferably are fabricated from an aluminum alloy. It is contemplated and within the scope of the present invention, however, that the first and second heat sink pieces 102 and 104, respectively, may be fabricated from a magnesium alloy, a copper alloy, a beryllium copper alloy, a beryllium aluminum alloy, a carbon fiber composite, a thermally conductive plastic or any other material with good thermal conductive properties and mechanical rigidity. It is further contemplated and within the scope of the present invention that either or both the first and second heat sink pieces 102 and 104 may be fabricated by die casting, stamping, extruding, molding, injection molding, powdered metal forming or the like.

Preferably the first heat sink piece 102 is fabricated by die casting and the second heat sink piece 104 is fabricated by stamping. Most preferably the first heat sink piece 102 is fabricated from die cast Aluminum 413 Alloy and the second heat sink piece 104 is fabricated from a stamped Aluminum 1100 Alloy. It is contemplated and within the scope of the present invention, however, that the second heat sink piece 104 may be fabricated by die casting.

The first heat sink piece 102 has a plurality of first offsetting mounting brackets 110, and the second heat sink piece 104 has a plurality of second offsetting mounting brackets 112. The first plurality of offsetting mounting brackets 110 correspond and align with the plurality of mounting sites 160 on the substrate 150, which further correspond and align with the plurality of second offsetting mounting brackets 112.

Referring now to FIGS. 3, 4, 5, and 6, the thermal management structure 100 is illustrated in a perspective view, front elevation view, top plan view, and bottom plan view, respectively. Here the thermal management structure 100 is in an assembled form in functional cooperation with the chip-on-board substrate 150.

The first offsetting mounting brackets 110 align with the mounting sites 160 and rigidly engage the first side 152 of substrate 150. The second offsetting mounting brackets 112 align with the mounting sites 160 and rigidly engage the second side 154 of substrate 150. Fasteners 108 are used to fasten and firmly secure the first offsetting mounting brackets 110 to the second offsetting mounting brackets 112, thereby sandwiching the chip-on-board substrate in an unmoving relationship between the first heat sink piece 102 to the second heat sink piece 104, and also compressing the interposed interface pads 106a, b and c. By sandwiching and fixedly fastening the chip-on-board substrate 150 between the first and second heat sink pieces 102 and 104, the fragile unpackaged die 158 is mechanically isolated and therefore much less likely to be subjected to mechanical trauma during normal handling.

The fasteners 108 are preferably screws, however, it is contemplated and within the scope of the present invention that alternate fastening means may be employed, such as bolts and nuts, pins, clips, adhesives, glues, epoxies or the like.

Figure 4:
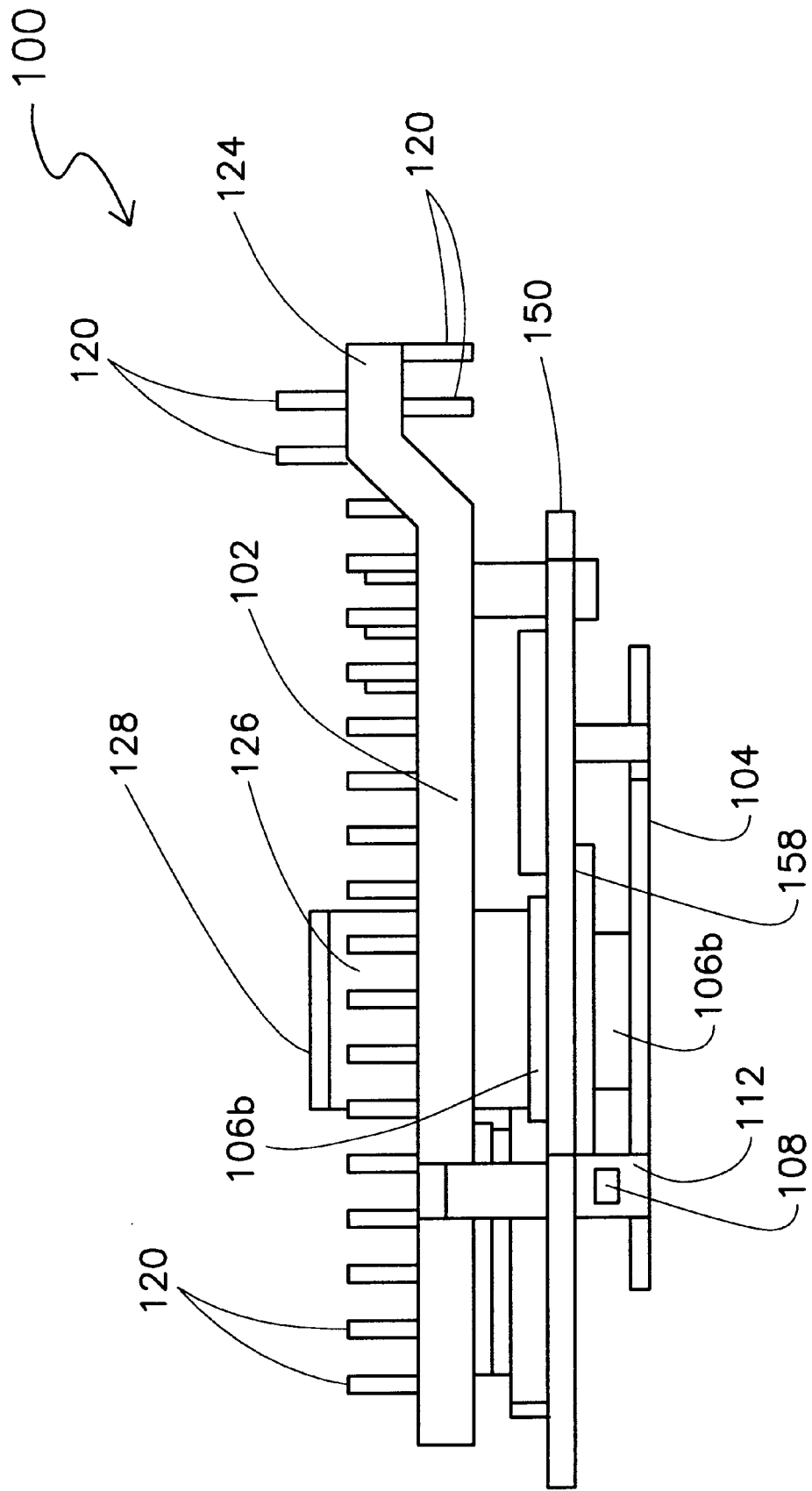
FIG. 4 is a front elevation view of an embodiment of the thermal management structure.
Figure 5:
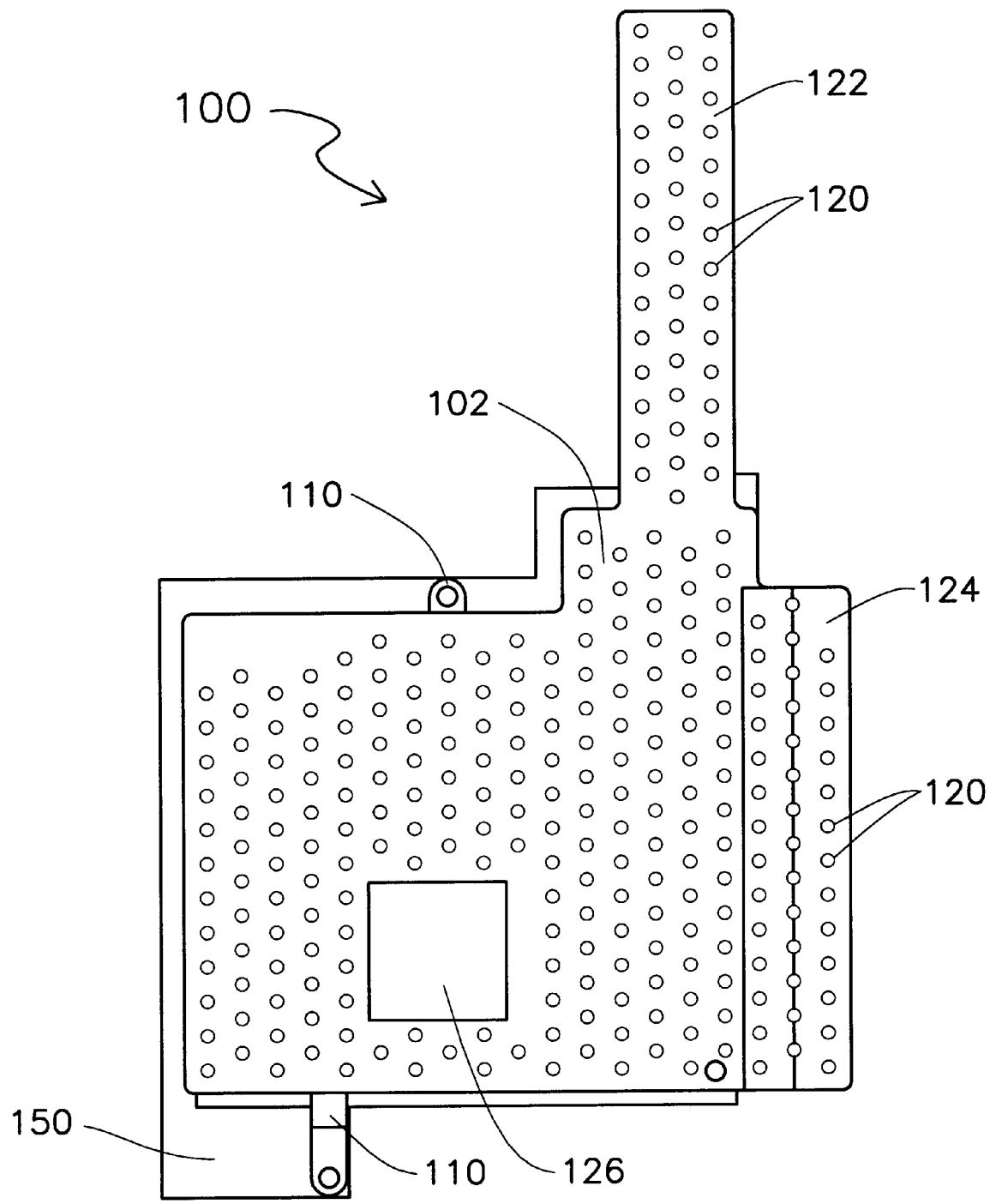
FIG. 5 is a top plan view of an embodiment of the thermal management structure.
Figure 6:
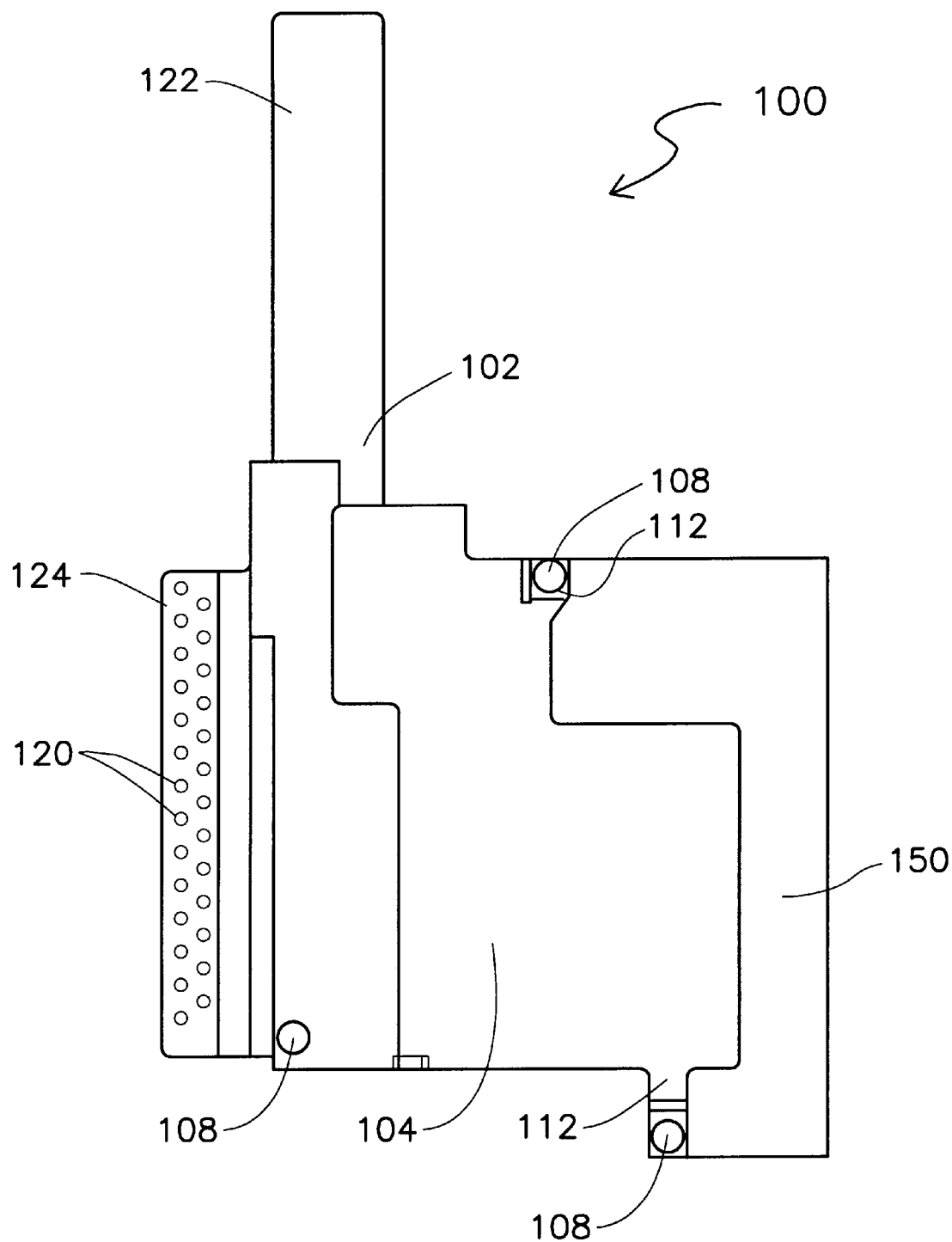
FIG. 6 is a bottom plan view of an embodiment of the thermal management structure.

As best viewed in FIG. 4, the thermal interface pad 106a compliantly engages and thermally interconnects the exposed face 164 of the unpackaged die 158 with the second heat sink piece 102. Similarly, thermal interface pad 106b compliantly engages and thermally interconnects the board side 168 of the substrate 150 with the first heat sink piece 104. Thermal interface pad 106c compliantly engages and thermally interconnects the packaged die 156b with the first heat sink piece 104.

The thicknesses of the respective interface pads 106a, b and c should each be slightly greater than the distances separating the respective surfaces which they each thermally interconnect. By so doing each interface pad will be provided with sufficient compressive force to conform the interface pad to the respective surfaces, while simultaneously not subjecting the unpackaged die 158 or substrate 150 to any damaging compressive force or deflection.

Referring to FIGS. 1, 2, 3, 4, and 5 an aspect of the present invention is illustrated. An outer face 118 of the first heat sink piece 102 is selectively populated with a plurality of extended surfaces 120 which are thermally conductive. The plurality of extended surfaces 120 increase the surface area to mass ratio, thereby increasing the convective and radiant transfer of heat to the ambient environment. Preferably the plurality of extended surfaces 120 are pins, and most preferably are cylindrical pins. It is contemplated and within the scope of the present invention, however, that the plurality of extended surfaces 120 may be ribs or pins, and the pins may have a non-circular cross-section (i.e. non-cylindrical) such as elliptical, rectangular, square or the like. It is contemplated and within the scope of the present invention that a plurality of extended surfaces may be selectively located on either, both, or neither the first heat sink piece 102 and/or the second heat sink piece 104.

Another aspect of the present invention is that the first heat sink piece 102 and the second heat sink piece 104 can each be shaped and sized independent of each other to conform to the space available in a specific electronic product while providing heat conduction pathways to cooler distant points in the electronic product. For the purposes of illustration, and not limitation, the first heat sink piece 102 has a first projection 122 which extends the heat sink mass in the plane of the first heat sink piece 102 (best viewed in FIGS. 1, 3, 5 and 6) and a second projection 124 which extends the heat sink mass out of the plane of the first heat sink piece 102 (best viewed in FIGS. 1, 2, 3 and 4).

It is further contemplated and within the scope of the present invention that a plurality of extended surfaces may be selectively located on the inside face of one or more projections extending from either the first heat sink piece 102 or the second heat sink piece 104. For example, referring to FIGS. 4 and 6, a plurality of extended surfaces 120 are selectively located on the first inside face 114 on the second projection 124 of the first heat sink piece 102.

The first heat sink piece 102 may have a thermal mass block 126 (best viewed in FIGS. 1, 2, 3, 4 and 5) which is located proximate to the board side 168 of the unpackaged die 158, and which also projects out of the plane of the first heat sink piece 102. The thermal mass block 126 provides a large cross-sectional area to conductively remove heat from the unpackaged die 158 to a supplemental thermal enhancement (not illustrated). The thermal mass block may be thermally connected to the supplemental thermal enhancement by using a mechanically compliant and thermally conductive external interface pad 128, such as a aluminum oxide filled silicone elastomer pad, or other thermal conductive interface means such as, but not limited to: thermally conductive grease, thermally conductive wax, thermally conductive epoxy, thermally conductive screws or the like.

Figure 7:
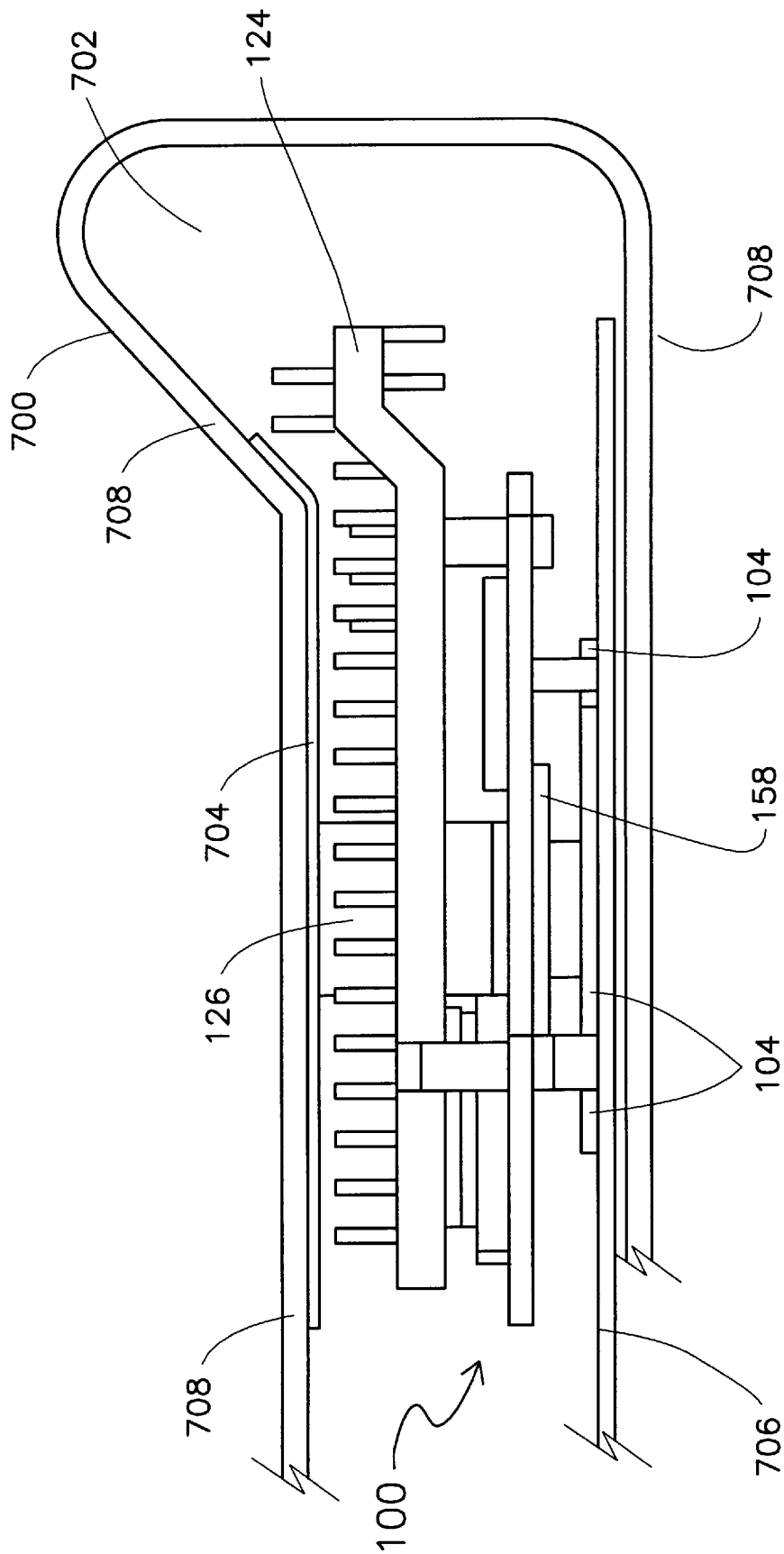
FIG. 7 is a front elevation view of an embodiment of the thermal management structure.

Referring now to FIG. 7 the thermal management structure 100 is illustrated in a front elevation view inside an electronic product 700 (partially illustrated). The electronic product 700 has a plurality of electrical terminals and signal terminals (not illustrated) which are interconnected (not illustrated) to the chip-on-board substrate 150 and a chassis 708 for receiving and containing the thermal management structure 100. The electronic product 700 could be one of a number of electronic products which use semiconductor devices, including, but not limited to: a personal digital assistant, a lap top computer, a notebook computer, a sub-notebook computer, a desktop computer, a printer, a scanner, a modem or the like.

As discussed above a projection, such as the second projection 124, can be used to extend the heat sink mass into an available space 702 of the electronic product. Also as discussed above, the thermal mass block 126 may be thermally connected to a supplemental thermal enhancement. Here, a thermally conductive first electronic product component 704 may be thermally connected to the thermal mass block 126. The first electronic product component 704 is used to further conductively spread heat to distant points within the electronic product 700. Similarly, the second heat sink piece 104 may be thermally connected to a thermally conductive second electronic product component 706, also used to further conductively spread heat to other distant points within the electronic product 700. The first and second electronic product components 704 and 706 may be any electronic product component which will not be damaged by the conducted heat, such as, but not limited to: a chassis, frame, superstructure, case or the like.

Figure 8:
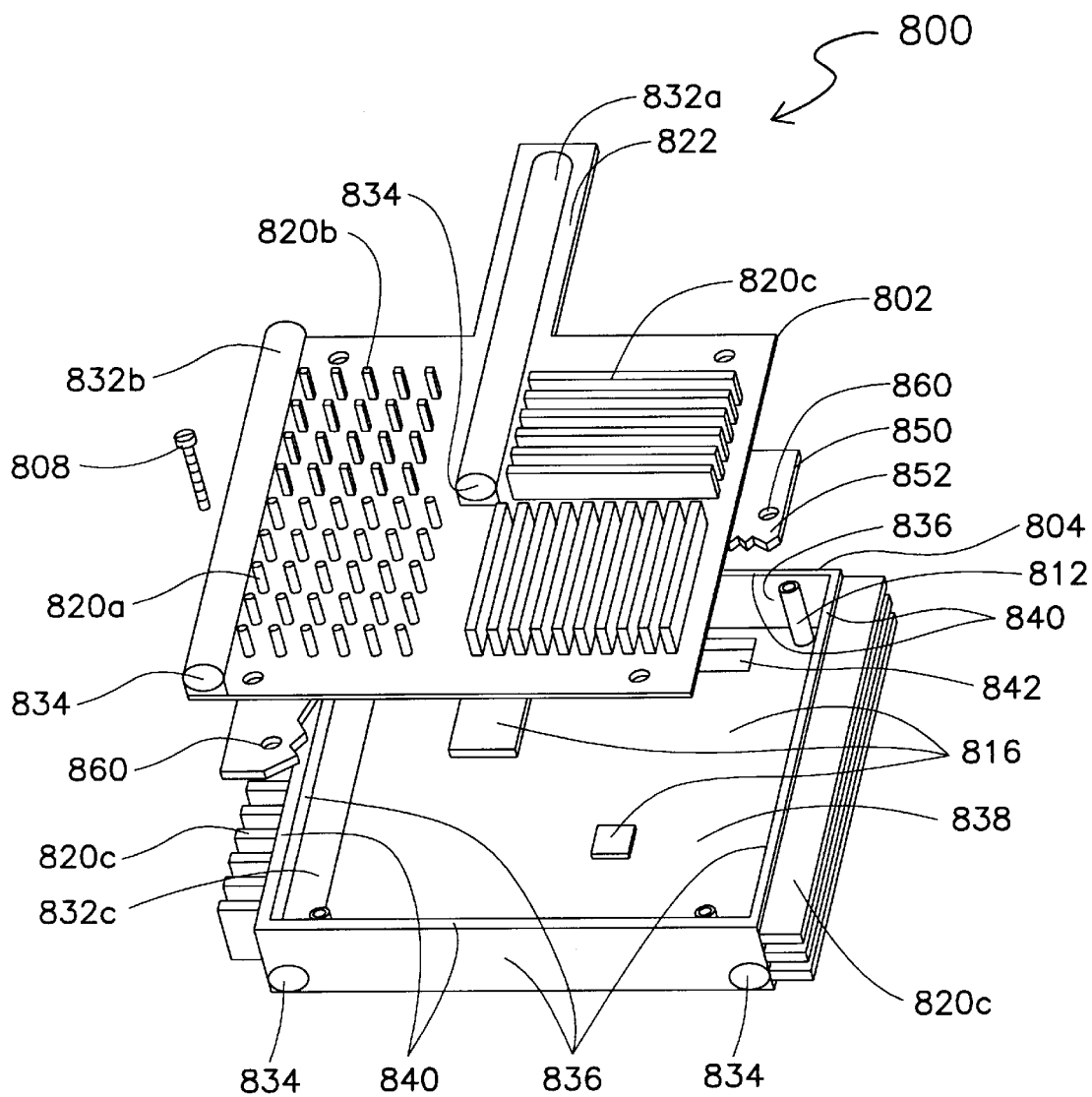
FIG. 8 is an exploded perspective view of another embodiment of the thermal management structure.
Figure 9:
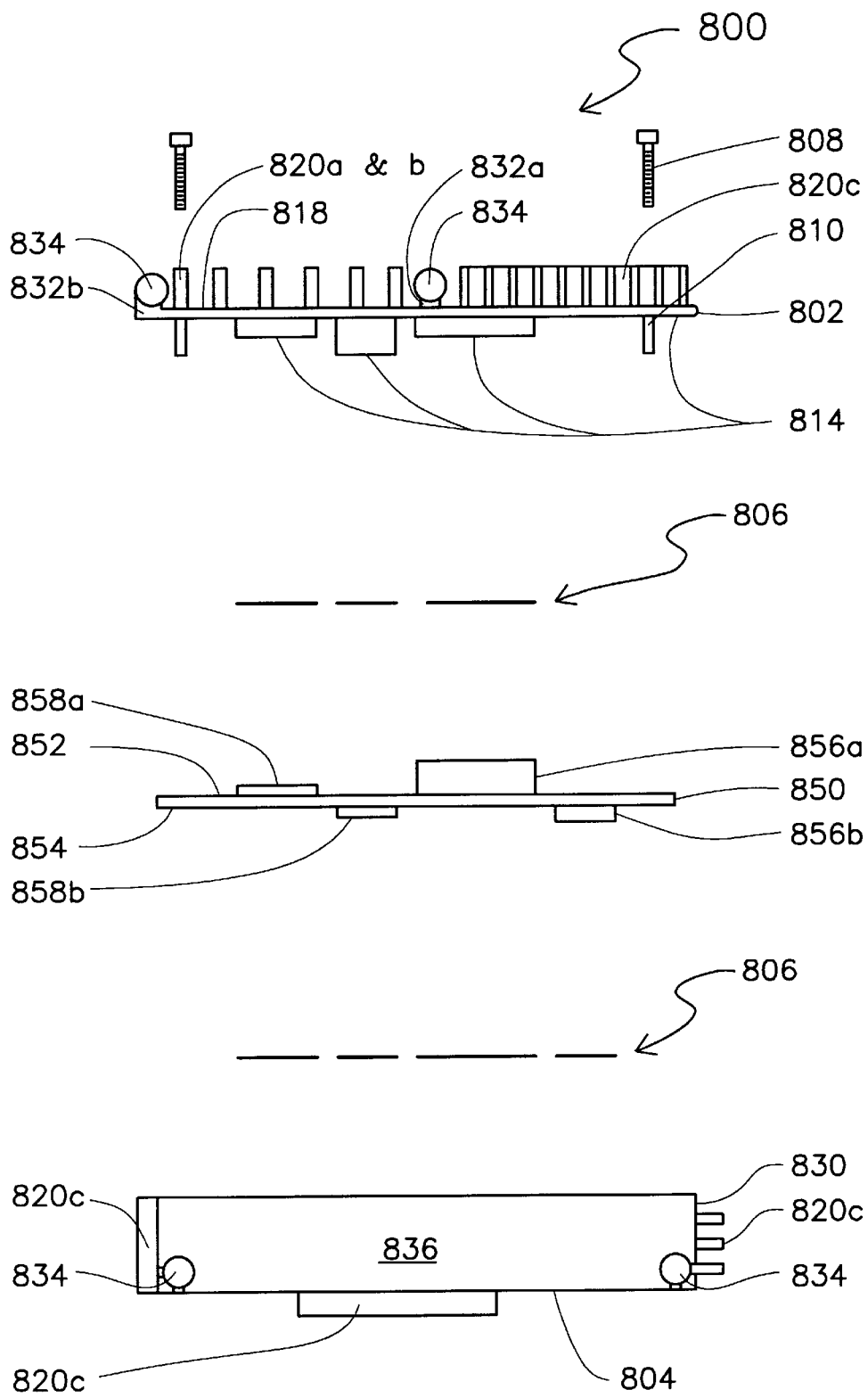
FIG. 9 is an exploded front elevation view of another embodiment of the thermal management structure.

Referring now to FIGS. 8 and 9, another embodiment of a thermal management structure 800 is illustrated in an exploded perspective view (partially illustrated in FIG. 8) and exploded front elevation view (FIG. 9). The thermal management structure 800 comprises four main parts: a first heat sink piece 802, a second heat sink piece 804, a plurality of thermal interface pads 806, and a plurality of fasteners 808. For the purpose of illustrative clarity, and not limitation, FIG. 8 only illustrates the first heat sink piece 802 and second heat sink piece 804 and a portion of a substrate 850 illustrated as a cutaway.

The thermal management structure 800 is in a thermal and mechanical functional cooperation with the substrate 850. The substrate 850 has a first side 852 and a second side 854, a plurality of packaged dice 856a and b (best viewed in FIG. 9), a plurality of unpackaged die 858a and b (best viewed in FIG. 9), and a plurality of mounting sites 860 (best viewed in FIG. 8). For the purpose of illustrative clarity, and not limitation, the plurality of mounting sites 860 are illustrated as holes, however, it is contemplated and with in the spirit of the present invention that some or all of the mounting sites may be holes, slots, grooves, pins or the like.

For the purpose of illustrative clarity, and not limitation, the plurality of packaged dice 856a and b are mounted respectively on the first side 852 and the second side 854 of substrate 850 and the plurality of unpackaged dice 858a and b are mounted respectively on the first side 852 and the second side 854 of substrate 850 (best viewed in FIG. 9). The selection, number and relative positioning of unpackaged and packaged dice on a given substrate is outside the scope of the present invention. It is contemplated, however, and within the scope of the present invention, that the thermal management structure 800 may be adapted to functionally cooperate with a wide variety of unpackaged and/or packaged dice mounted on either or both sides of a substrate.

Sites on the substrate 850 are selected which have sufficient waste heat generation so as to require thermal enhancement to remove the waste heat. It is contemplated and within the scope of the present invention, that a substrate may have only one site or a plurality of sites which may require thermal enhancement to remove generated waste heat. For the purpose of illustration, and not limitation, it should be assumed that the plurality of packaged dice 856a and b and the plurality of unpackaged dice 858a and b all generate sufficient waste heat and require thermal enhancement on both the board side and the exposed face side of each die.

The plurality of thermal interface pads 806 are selected and sized to engage the selected sites on the substrate 850 requiring thermal enhancement. Preferably the length and breadth of the thermal interface pads 806 will be equal to or less than the corresponding length and breadth of the selected sites. The interface pads 806 are a mechanically compliant and thermally conductive material. Preferably the interface pads 806 are aluminum oxide filled silicone elastomer pads. It is contemplated and within the scope of the present invention, however, the interface pads 806 may be a thermally conductive grease, thermally conductive wax, thermally conductive elastomeric pad or the like, provided the interface pad is mechanically compliant and thermally conductive.

Referring to FIG. 9, the interface pads 806 are interposed between the selected sites on the substrate 850 and either a first inside face 814 (best viewed in FIG. 8) of the first heat sink piece 802 or a second inside face 816 (best viewed in FIG. 9) of the second heat sink piece 804. The thicknesses of the interface pads 806 should each be slightly greater than the distances separating the respective surfaces which they each thermally interconnect. By so doing each interface pad will be provided with sufficient compressive force to conform the interface pad to the respective surfaces, while simultaneously not subjecting the packaged dice 856a and b, the unpackaged dice 858a and b, or substrate 850 to any damaging compressive force or deflection.

The first and second heat sink pieces 802 and 804 preferably are fabricated from an aluminum alloy, and most preferably fabricated from a beryllium aluminum alloy. It is contemplated and within the scope of the present invention, however, that the first and second heat sink pieces 802 and 804, respectively, may be fabricated from a magnesium alloy, a copper alloy, a beryllium copper alloy, a carbon fiber composite, a thermally conductive plastic or any other material with good thermal conductive properties and mechanical rigidity. Preferably the material also has electromagnetic shielding properties. It is further contemplated and within the scope of the present invention that either or both the first and second heat sink pieces 802 and 804 may be fabricated by die casting, stamping, extruding, molding, injection molding, powdered metal forming or the like. Preferably both the first heat sink piece 802 and the second heat sink piece 804 are fabricated by die casting.

The first heat sink piece 802 has a plurality of first offsetting mounting brackets 810 (best viewed in FIG. 9), and the second heat sink piece 804 has a plurality of second offsetting mounting brackets 812 (best viewed in FIG. 8). The first plurality of offsetting mounting brackets 810 correspond and align with the plurality of mounting sites 860 on the substrate 850, which further correspond and align with the plurality of second offsetting mounting brackets 812.

The first offsetting mounting brackets 810 align with the mounting sites 860 and rigidly engage the first side 852 of substrate 850. The second offsetting mounting brackets 812 align with the mounting sites 860 and rigidly engage the second side 854 of substrate 850. Fasteners 808 are used to fasten and firmly secure the first offsetting mounting brackets 810 to the second offsetting mounting brackets 812, thereby sandwiching the substrate 850 in an unmoving relationship between the first heat sink piece 802 to the second heat sink piece 804, and also compressing the interposed interface pads 806. By sandwiching and fixedly fastening the substrate 850 between the first and second heat sink pieces 802 and 804, the fragile unpackaged dice 858a and b are mechanically isolated and therefore much less likely to be subjected to mechanical trauma during normal handling. The fasteners 808 are preferably screws, however, it is contemplated and within the scope of the present invention that alternate fastening means may be employed, such as bolts and nuts, pins, clips, adhesives, glues, epoxies or the like.

A first outer face 818 of the first heat sink piece 802 and a second outer face 830 of the second heat sink piece 804 are selectively populated with a plurality of extended surfaces 820a, b and c which are thermally conductive. The plurality of extended surfaces 820a, b and c increase the surface area to mass ratio, thereby increasing the convective and radiant transfer of heat to the ambient environment. Preferably the plurality of extended surfaces 820a, b and c are cylindrical pins 820a. It is contemplated and within the scope of the present invention, however, that the plurality of extended surfaces 820a, b and c may be cylindrical pins 820a, non-cylindrical pins 820b and/or ribs 820c. It is contemplated and within the scope of the present invention that a plurality of extended surfaces may be selectively located on either, both, or neither the first heat sink piece 802 and/or the second heat sink piece 804.

Another aspect of the present invention is that the first heat sink piece 802 and the second heat sink piece 804 can each be shaped and sized independent of each other to conform to the space available in a specific electronic product while providing heat pathways to cooler distant points in the electronic product. Either or both of the first and second heat sink pieces 802 and 804 may have projections which extend the plane and/or project out of the plane of the heat sink piece. For the purposes of illustration, and not limitation, the first heat sink piece 802 has a projection 822 which extends the heat sink mass in the plane of the first heat sink piece 802 (best viewed in FIG. 8).

Another aspect of the present invention is that the first heat sink piece 802 and/or the second heat sink piece 804 may have one or more heat pipe receptacles 832*a, b* and *c* for holding heat pipes 834. The heat sink receptacles may extend the main plane of the heat sink piece (such as 832*a*) and/or project out of the main plain of the heat sink piece (such as 832*a* and *b*) to enhance heat removal to distant points. The heat pipe receptacles may be positioned proximate to the substrate 850 (such as 832*c*) to more evenly distribute waste heat across the heat sink piece.

The heat pipes 834 are sealed cavities which are filled with a coolant (e.g. water, HFC's, CFC's or the like). A partial volume of the cavity is occupied by the coolant in the liquid phase and the remaining cavity volume is filled with the coolant in the vapor phase. A heat pipe can efficiently and rapidly transfer large quantities of heat by convective heat transfer via boiling the liquid coolant (evaporative cooling) with the heat source and then condensing the vapor coolant back to a liquid with the cooler ambient environment. The heat pipe cavity may further contain a wicking material to move the liquid phase to the point of evaporation (i.e. the heat source) via capillary action. A wicking material eliminates the need for the heat pipe to be maintained in a specific orientation so that gravitational forces may transport the liquid to a low point near the heat source.

Another aspect of the present invention is that one of the two heat sink pieces may have a lip which is shaped and sized to both encircle the edges of the substrate and electromagneticly seal against the inside surface of the other heat sink piece thereby providing an electromagnetic shield around the substrate.

Referring to FIGS. 8 and 9, for the purpose of illustration, and not limitation, the second heat sink piece 804 has a lip 836 which extends away from the second inside face 816 and forms a cavity 838. It is contemplated and within the scope of the present invention, however, that the lip could be formed on the first heat sink piece 802. Here, the lip 836 is sized and shaped to allow the substrate 850 to be inserted into the cavity 838. The lip 836 also has a seal edge 840 which seals against the first inside face 814 of the first heat sink piece 802 to form an electromagnetic seal. When the substrate 850 is enclosed in the cavity 838, and the first and second heat sink pieces 802 and 804 have been fastened together, the two heat sink pieces 802 and 804 together with the lip 836 function as an electromagnet shield which isolates any electromagnet fields generated by the substrate 850 from the electromagnetic environment surrounding the thermal management structure 800. The second heat sink piece 804 also has an opening 842 which allows the electrical interconnection of the substrate 850 with a plurality of external electrical terminals (not illustrated) and external signal terminals (not illustrated).

The lip 836 may optionally serve two other useful functions. First the lip 836 may be fabricated to closely contour one or more edges or surfaces of the substrate 850 to further assist in the alignment of the substrate 850 in a predetermined configuration with the second heat sink piece 804 and mounting brackets 812. Second, the lip 836 may be used as a spacer, or offset, which defines and maintains a predetermined minimum distance between the first inside face 814 of the first heat sink piece 802 and the second inside face 816 of the second heat sink piece 802.

Figure 10:
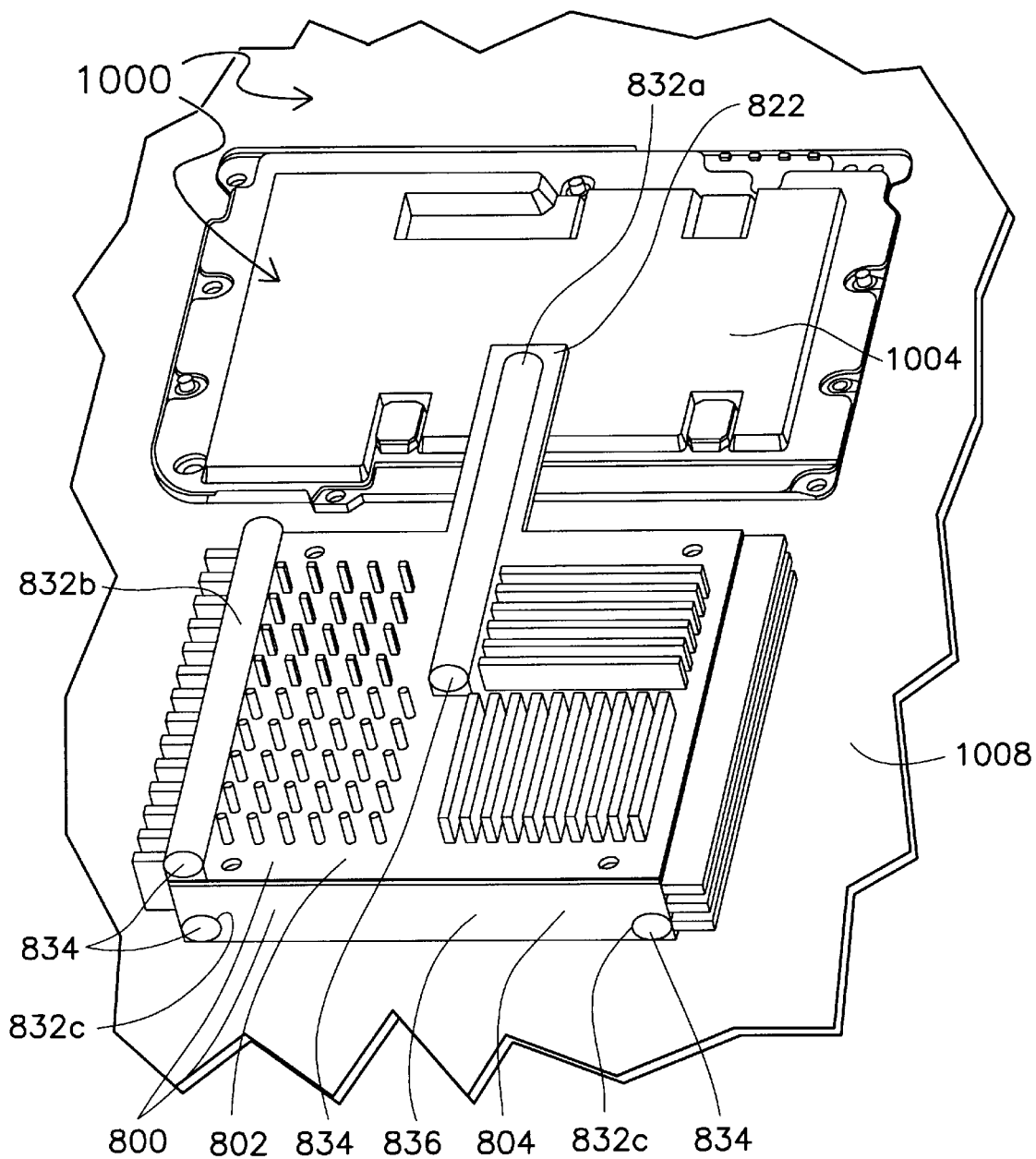
FIG. 10 is a perspective view of another embodiment of the thermal management structure.

Referring now to FIG. 10, another embodiment of the thermal management structure 800 is illustrated in an exploded perspective view inside an electronic product 1000 (partially illustrated). The electronic product 1000 has a plurality of electrical terminals and signal terminals (not illustrated) which are interconnected (not illustrated) to the substrate 850 (not illustrated). The electronic product 1000 also has a chassis 1008 for receiving and containing the thermal management structure 800. The electronic product 1000 could be one of a number of electronic products which use semiconductor devices, including, but not limited to: a personal digital assistant, a lap top computer, a notebook computer, a sub-notebook computer, a desktop computer, a printer, a scanner, a modem or the like.

As discussed above a projection, such as the first projection 822, can be used to extend the heat sink mass into an available space of the electronic product. Also the heat pipe receptacles 832*a* and *c* having heat pipes 834 may be thermally connected to supplemental thermal sinks. Here, a thermally conductive first electronic product component 1004 may be thermally connected to the heat pipe receptacle 832*a* having a heat pipe 834. The heat pipe 834 contained in the heat pipe receptacle 832*a* convectively transfers waste heat from the thermal management structure 800 to the first electronic product component 1004. The first electronic product component 1004 then further conductively spreads the waste heat to distant points within the electronic product 1000.

Similarly, the second heat sink piece 804 may be thermally connected to a thermally conductive second electronic product component 1008 (the chassis), also used to further conductively spread heat to other distant points within the electronic product 1000. The heat sink receptacles 832*c* having heat pipes 834 convectively distribute the waste heat across the second heat sink piece 804, thereby providing maximum thermal communication with the second electronic product component 1008. The first and second electronic product components 1004 and 1008 may be any electronic product component which will not be damaged by the conducted heat, such as, but not limited to: a chassis, frame, superstructure, case or the like.

Figure 11:
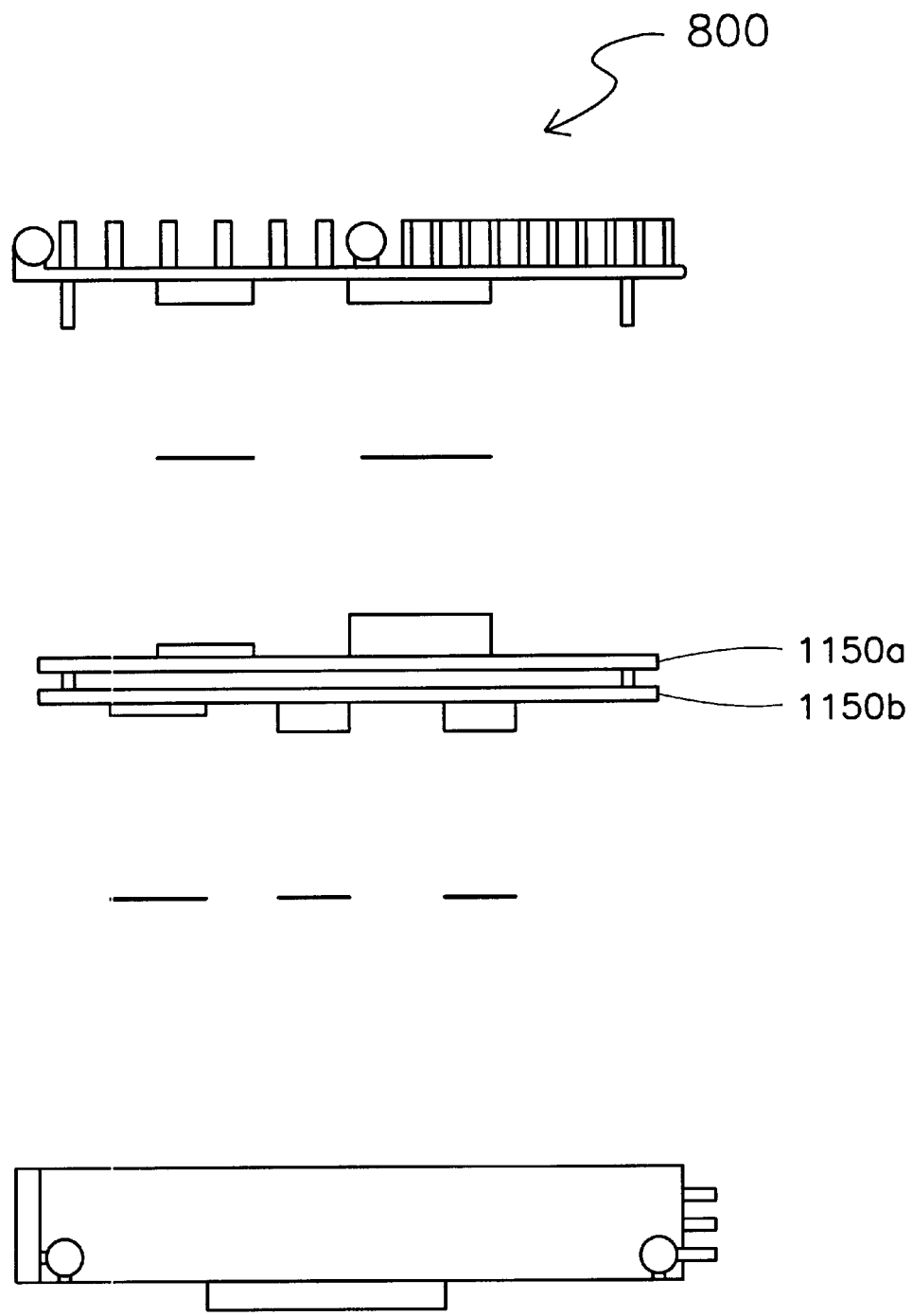
FIG. 11 is an exploded front elevation view of another aspect of the thermal management structure.

Referring now to FIG. 11, an aspect of the present invention is illustrated in exploded front elevation view. The thermal management structure 800 may be used with a bi-planar substrate assembly of two substrates 1150*a* and *b* arranged and interconnected as parallel planes which operate both electrically and mechanically as a single unit. The selection of a single substrate 850 or a bi-planar substrate 1150*a* and *b,* and the relative positioning of the bi-planar substrates 1150*a* and *b* with respect to each other (i.e. the relative position of substrate 1150*a* with respect to substrate 1150*b*) is outside the scope of the present invention. It is contemplated, however, and within the scope of the present invention, that the thermal management structure 800 may be adapted to functionally cooperate with a wide variety of unpackaged and/or packaged dice mounted on either or both sides of a bi-planar substrate 1150*a* and *b*.

Figure 12:
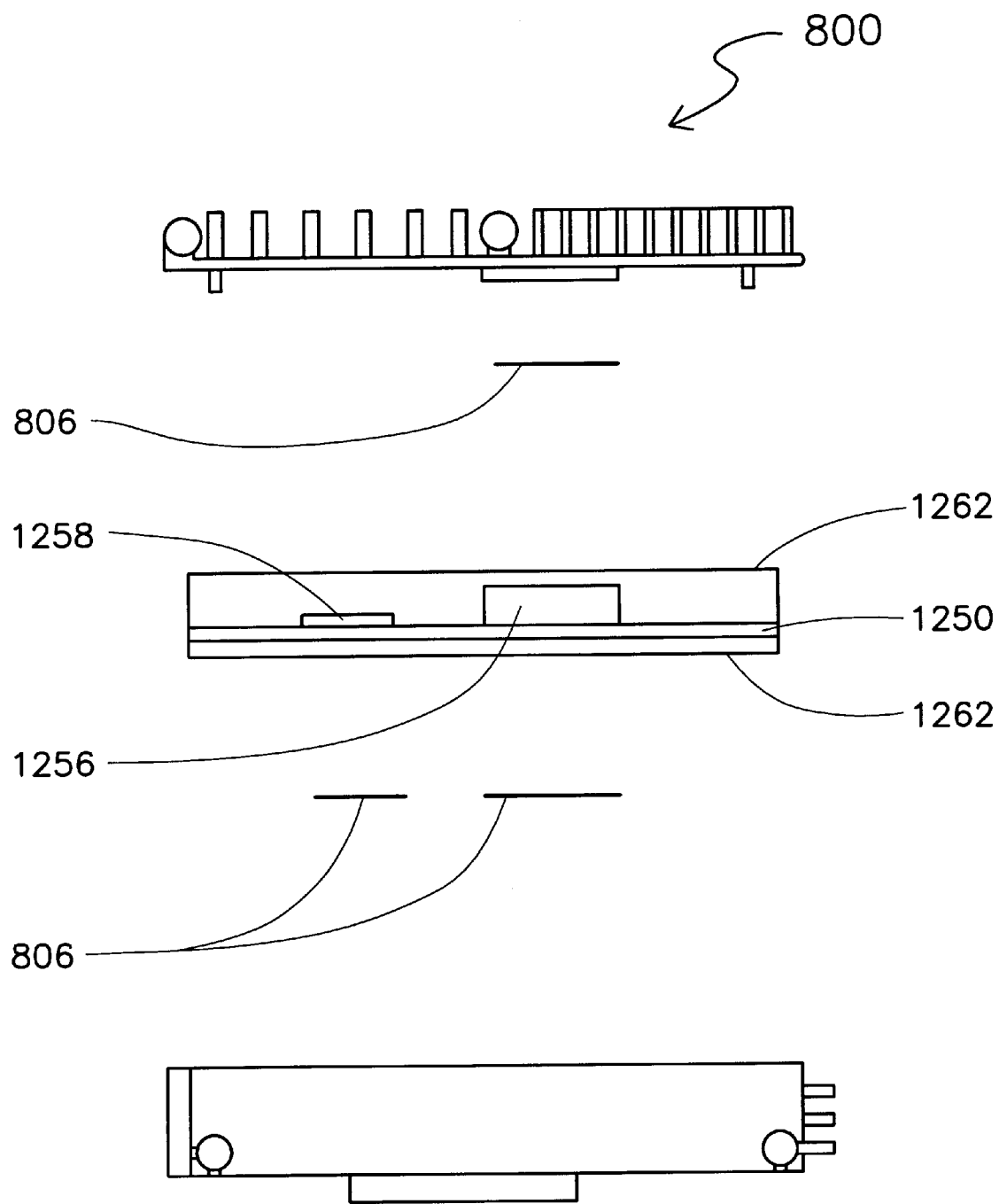
FIG. 12 is an exploded front elevation view of an aspect of the thermal management structure.

Referring now to FIG. 12, another aspect of the present invention is illustrated in exploded front elevation view. The thermal management structure 800 may be used with a substrate 1250 which has been enclosed in a thin walled enclosure 1262. The thin walled enclosure 1262 is a mechanically protective enclosure which has been placed around the substrate 1250 to prevent accidental touchings of the substrate 1250 and any packaged dice 1256 and/or unpackaged dice 1258 on the substrate 1250. Under circumstances where it is not desirable and/or not possible to remove the thin walled enclosure 1262 from the substrate 1250, the thermal management structure 800 can be easily adapted to accommodate the thin walled enclosure 1262.

As viewed in FIG. 12, the thermal interface pads 806 are positioned outside the thin walled enclosure 1262 proximate to the packaged dice 1256 and/or unpackaged dice 1258 which need thermal enhancement to remove waste heat. When the thin walled enclosure 1262 is fixedly mounted within the thermal management structure 800, the thermal interface pads 806 will engage the sites on the thin walled structure 1262 which need thermal enhancement in a mechanically compliant and thermally conductive manner.

Figure 13:
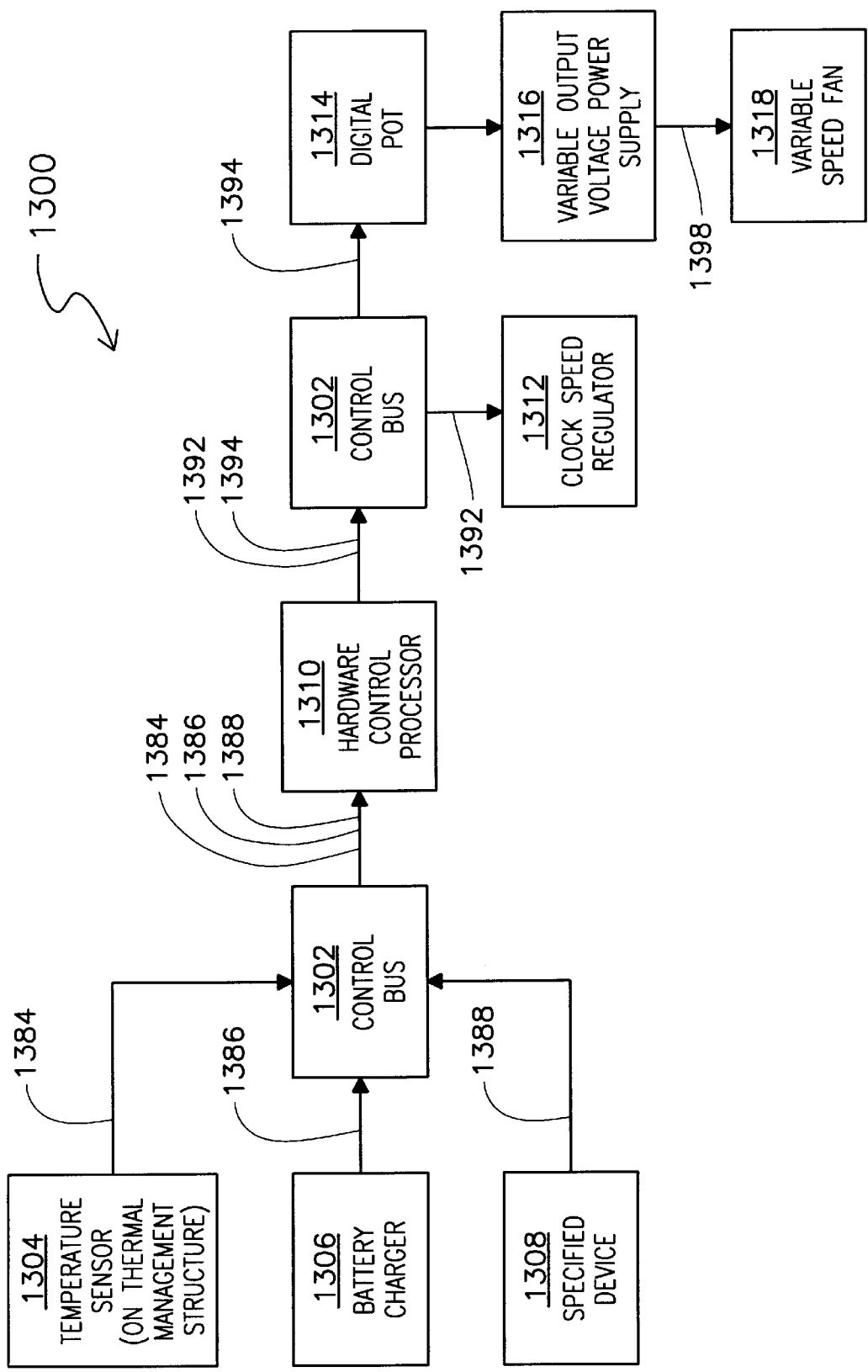
FIG. 13 is a schematic diagram of an embodiment of the thermal management controller in an electronic product.
Figure 14:
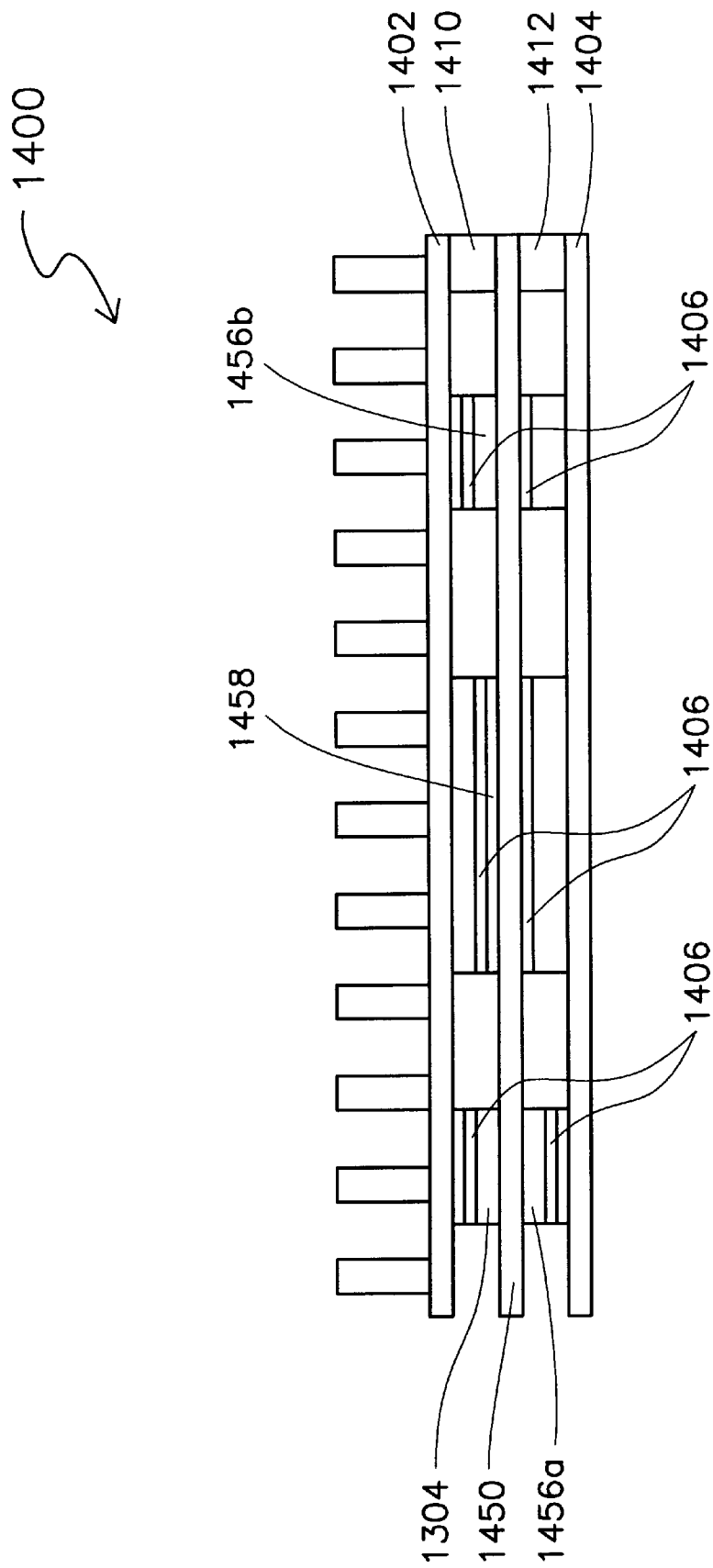
FIG. 14 is a front elevation view of an aspect of the thermal management structure.
Figure 15:
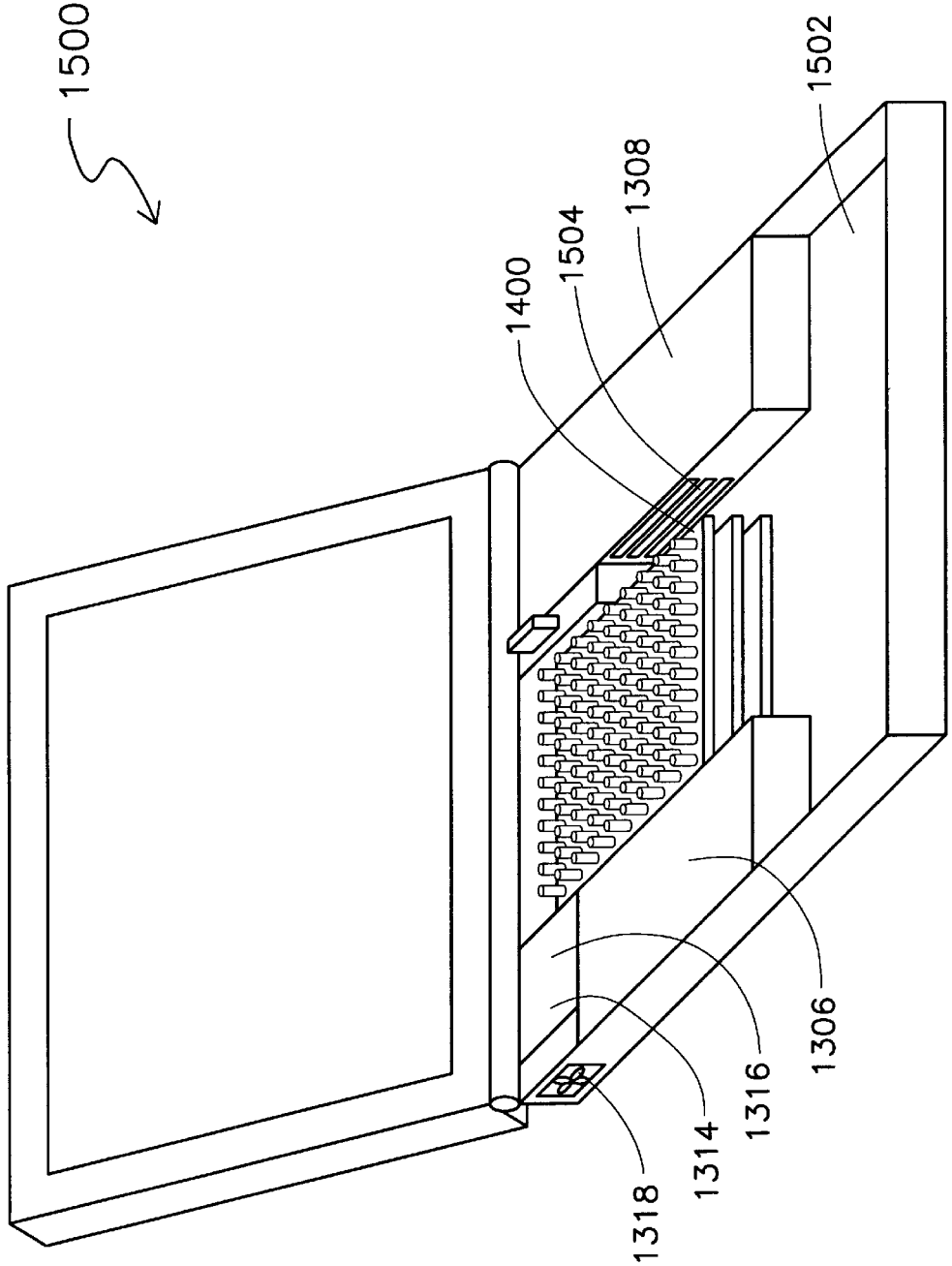
FIG. 15 is a cutaway perspective view of an embodiment of the thermal management controller in an electronic product.
Figure 16:
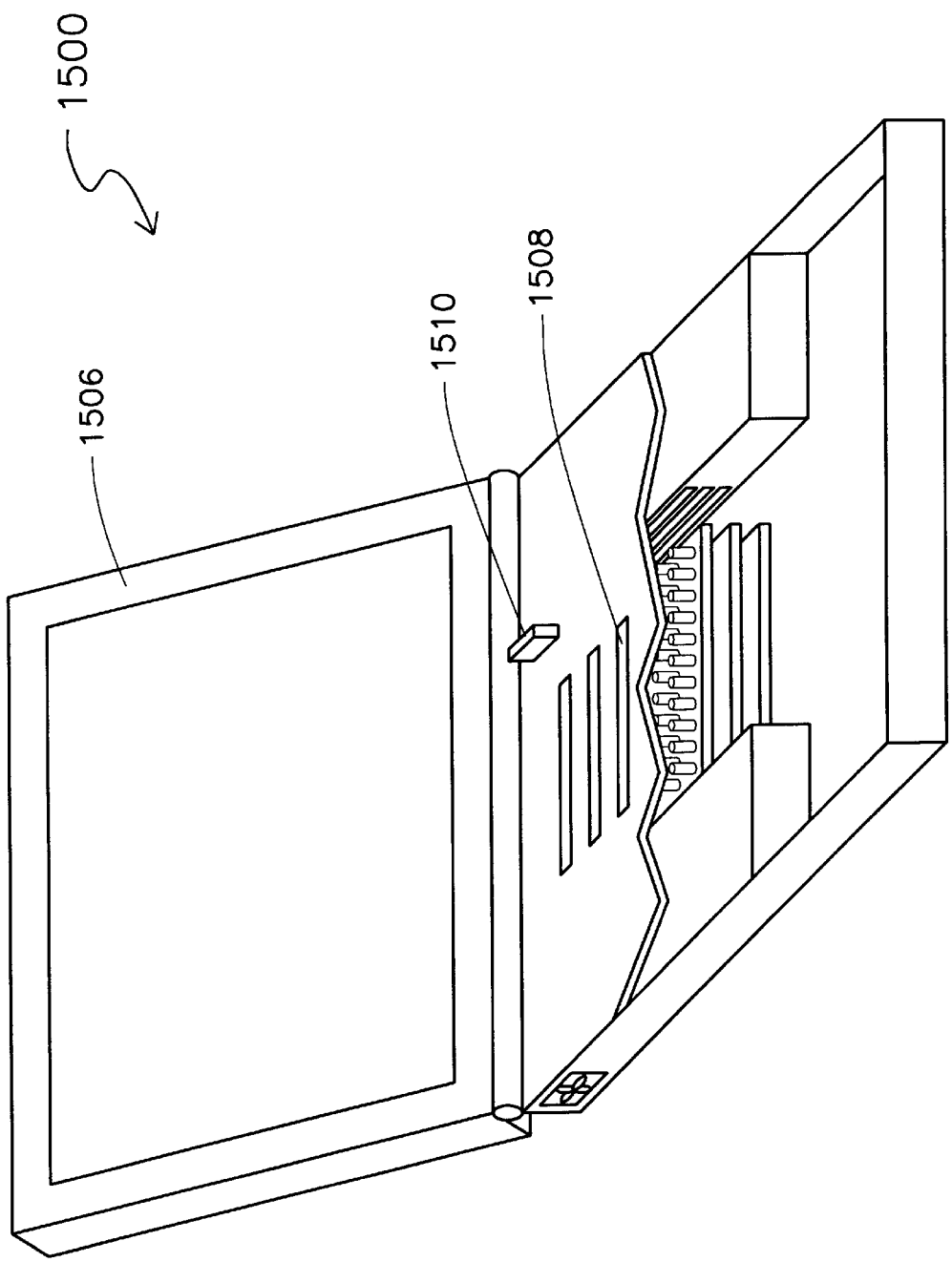
FIG. 16 is a cutaway perspective view of the embodiment of the thermal management controller in an electronic product.
Figure 17:
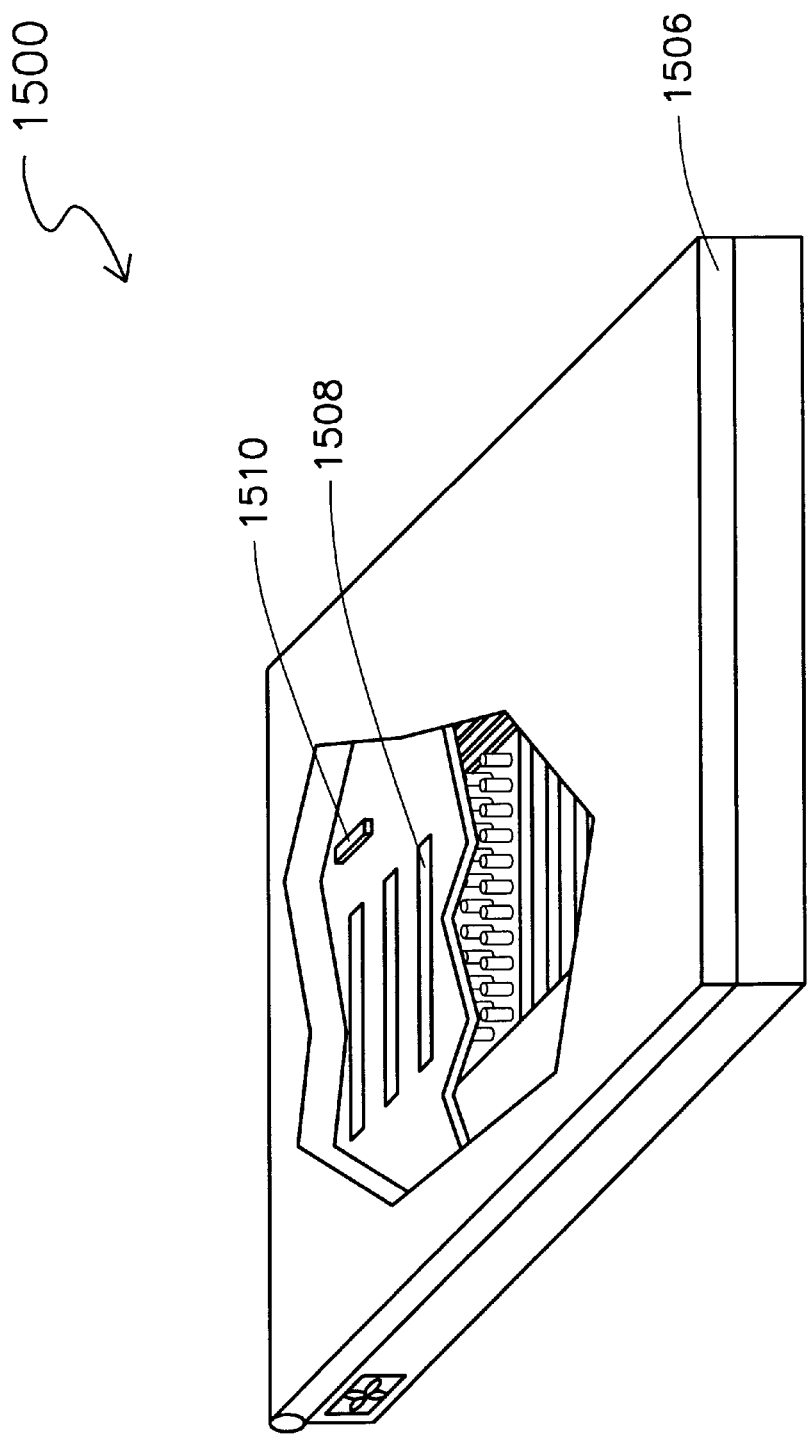
FIG. 17 is a cutaway perspective view of the embodiment of the thermal management controller in an electronic product.
Figure 18:
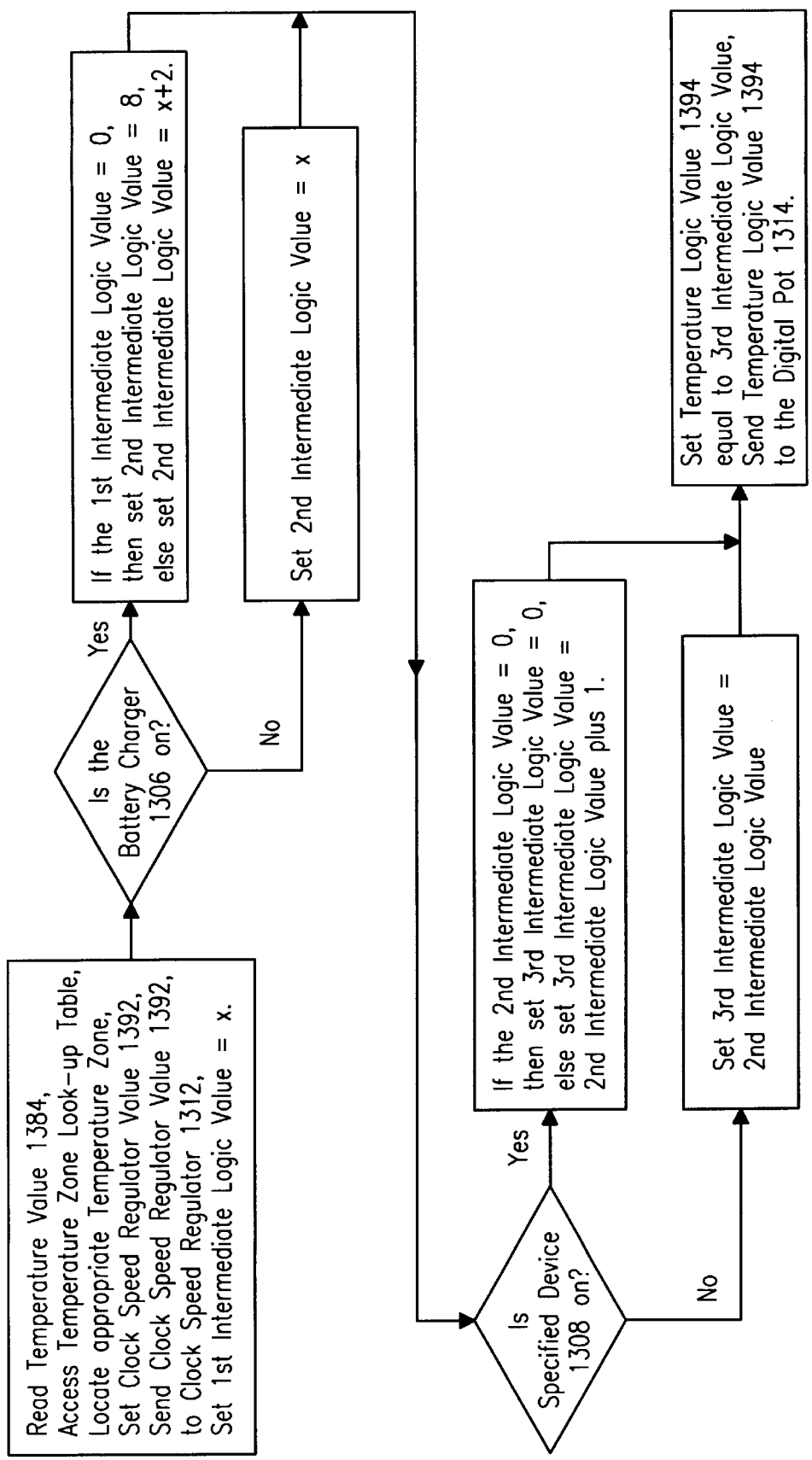
FIG. 18 is a schematic logic diagram of an aspect of the thermal management controller in an electronic product.

FIGS. 13 through 18 illustrate another embodiment of the invention. FIG. 13 illustrates a thermal management controller 1300 for an electronic product as a schematic diagram. FIG. 14 illustrates a thermal management structure 1400 having a temperature sensor 1304 in a front elevation view. FIGS. 15, 16, and 17 illustrate the thermal management controller inside an electronic product in cutaway perspective view. FIG. 18 illustrates a logic diagram used in the thermal management controller.

Referring now to FIG. 13, the thermal management controller 1300 comprises a control bus 1302, a temperature sensor 1304 in thermal contact with the thermal management structure 1400 (illustrated in FIG. 14), an AC/DC power supply/battery charger 1306, a specified device 1308, a hardware control processor 1310, a digital pot 1314, a variable output DC voltage power supply 1316, and a variable speed fan 1318.

The control bus 1302 is a bi-directional digital bus, and preferably is an integrated interconnect control bus. The control bus 1302 digitally interconnects signals from the temperature sensor 1304, the AC/DC power supply/battery charger 1306, and the specified device 1308 to the hardware control processor 1310. The control bus further digitally interconnects signals from the hardware control processor 1310 to the clock speed regulator 1312 and the digital pot 1314.

For the purpose of illustrative clarity, and not limitation, FIG. 13 only illustrates one specified device 1308. It is contemplated, however, and within the scope of the present invention, that the thermal management controller 1300 could have a plurality of specified devices digitally connected to the control bus 1302. For the purpose of illustrative clarity, and not limitation, FIGS. 13, 15, 16 and 17 only illustrates one variable speed fan 1318. It is contemplated, however, and within the scope of the present invention, that the thermal management controller 1300 could have a plurality of variable speed fans.

The temperature sensor 1304 measures the temperature of the thermal management structure 1400, and then transmits a temperature value 1384 to the control bus 1302. The AC/DC power supply/battery charger 1306 determines its status, and then transmits a battery charger status value 1386 to the control bus 1302. Similarly, the specified device determines its status, and then transmits a specified device status value 1388 to the control bus 1302.

The hardware control processor 1310 receives the temperature value 1384, the battery charger status value 1386, and the specified device status value 1388 from the control bus 1302. Using these input values the hardware control processor 1310 then calculates a clock speed regulator value 1392 and a fan speed logic value 1394 (the detailed discussion of the calculation logic appears below in reference to FIG. 18). The hardware control process then transmits the clock speed regulator value 1392 and the fan speed logic value 1394 to the control bus 1302.

The clock speed regulator 1312 receives the clock speed regulator value 1392, and adjusts if necessary, the clock speed of one or more semiconductor dice in thermal contact with the thermal management structure 1400 (see FIG. 14).

The digital pot 1314 receives the fan speed logic value 1394, and adjusts if necessary, the output voltage 1398 across the electric power output connections which connect the variable output DC voltage power supply 1316 to the variable speed fan 1318.

Referring to FIG. 14, the thermal management structure 1400 is illustrated in a front elevation view. Here the thermal management structure 1400 comprises a substrate 1450 sandwiched between a first heat sink piece 1402 and a second heat sink piece 1404. The substrate 1450 is rigidly connected to the first and second heat sink pieces 1402 and 1404 by a plurality of first and second offsetting mounting brackets 1410 and 1412 (only two mounting brackets are shown for illustrative clarity). For the purpose of illustrative clarity, and not limitation, the substrate 1450 is illustrated as having two high speed, high circuit density packaged dice 1456a and 1456b and a high speed, high circuit density unpackaged die 1458. The selection, number and relative positioning of unpackaged and packaged dice on a given substrate is outside the scope of the present invention. It is contemplated, however, and within the scope of the present invention, that the thermal management structure 1400 may be adapted to functionally cooperate with a wide variety of unpackaged and/or packaged dice mounted on either or both sides of substrate 1450.

The temperature sensor 1304 is also mounted on the substrate 1450. Thermal interface pads 1406 are disposed between, and thermally interconnect, the unpackaged die 1458, the packaged die 1456a, and the temperature sensor 1304 to the first heat sink piece 1402. Similarly, thermal interface pads 1406 are also disposed between, and thermally interconnect, the packaged die 1456a and the substrate 1450 to the second heat sink piece 1404. As the operating temperature of the dice 1456a, 1456b and 1458 increases (or decreases), the temperature of the first and second heat sink pieces 1402 and 1404 will similarly increase (or decrease). The temperature sensor 1304 measures the temperature of the first heat sink piece 1402, which closely approximates the temperature of the dice 1456a, 1456b and 1458. The temperature sensor 1304 is preferentially a device capable of measuring temperature and converting the temperature into a digital signal, however, it maybe a thermistor connected to a separate analog to digital converter. Though not specifically illustrated, it is contemplated that the hardware control processor 1310 and the clock speed regulator 1312 may be mounted on the substrate 1450 in the thermal management structure 1400. It is further contemplated that the clock speed regulator 1312 may be a plurality of clock speed regulators 1312. It is further contemplated that any given clock speed regulator 1312 may be merely a subset of circuits contained within the semiconductor die for which the clock speed is to be regulated.

Referring now to FIGS. 15, 16, and 17, a typical electronic product 1500 utilizing the thermal management controller 1300 is illustrated in partial cutaway perspective view. Here the electronic product 1500 is illustrated as a "clam shell" laptop computer. It is contemplated, and within the scope of the invention, that the electronic product could be any one of a number of electronic systems, including but not limited to a notebook computer, a sub-notebook computer, a desktop computer, a server computer, a printer, or a scanner.

Referring now to FIG. 15, the electronic product 1500 has a chassis 1502. The chassis contains the thermal management structure 1400, the AC/DC power supply/battery charger 1306, and the specified device 1308. The specified device could be one or more of the following heat producing devices: a CD-ROM drive, a hard disk drive, a removable disk drive, a PCMCIA card or the like. The chassis also contains the control bus 1302 (not illustrated), the digital pot 1314, the variable output voltage supply 1316, and the variable speed fan 1318. The chassis has vent holes 1504 through which air can pass when the fan 1318 is turned on.

Referring now to FIGS. 16 and 17, an aspect of the electronic product 1500 is illustrated. In FIG. 16 the lid 1506 is open and a second set of vent holes 1508 are exposed to the air surrounding the electronic product 1500 and a switch 1510 is in the open position. In FIG. 17 the lid 1506 is closed. When the lid 1506 is closed, the second set of vent holes 1508 are effectively closed thereby preventing the free passage of air through the second set of vent holes and the switch 1510 is depressed into the closed position by the lid 1506. Here the switch 1510 (which is normally used to de-energize the monitor contained in the lid) can also be used as a specified device 1308' to send a signal to the hardware control processor 1310 that the heat load of the system will increase because the vent holes 1508 have been closed.

Refer now to FIG. 18. FIG. 18 schematically illustrates the logic used by the hardware control processor 1310 to calculate the clock speed regulator value 1392 and the fan speed logic value 1394. Note that the determination of the clock speed regulator value 1392 is solely a function of the temperature of the thermal management structure 1400, whereas the determination of the fan speed logic value 1394 (and therefore the ultimate speed of the variable speed fan 1318) is a function of (1) a variable representing the temperature of the thermal management structure plus (2) a variable representing any additional heat loads produced by operation of the battery charger 1306 plus (3) a variable representing any additional heat loads produced by operation of any specified device 1308.

The hardware control processor 1310 reads the temperature value 1384 from the control bus 1302. The hardware control processor 1310 then accesses the temperature zone look-up table (See Table 1, below). The hardware control processor 1310 first compares the temperature value 1384 with the low and high temperature thresholds for the current zone. The high and low threshold temperatures for each zone illustrated in Table 1, as well as the number of zones in Table 1 are believed to be the best mode for practicing the invention, however, it is contemplated other high and low thresholds for each zone, as well as the number of zones, will vary with specific applications of the invention.

TABLE 1

Temperature Zone Look-up Table

| Zone | Low Temperature Threshold (Celsius) | High Temperature Threshold (Celsius) | Clock Speed Regulator Value (Percent) | first Intermediate Logic Value (Hexadecimal) |
|---|---|---|---|---|
| 0 | −127 | 60 | 100 | 0 |
| 1 | 55 | 65 | 100 | 7 |
| 2 | 61 | 69 | 100 | 8 |
| 3 | 66 | 73 | 100 | 9 |
| 4 | 70 | 79 | 100 | A |
| 5 | 77 | 86 | 75 | C |
| 6 | 84 | 88 | 50 | F |
| 7 | 86 | 127 | Off | F |

If the temperature value 1384 is within the thresholds for the current zone, the processor 1310 will set a clock speed regulator value 1392 from the table and will also set the first intermediate logic value from the table. For example, if the temperature value 1384 was 68 degrees Celsius and the current zone is 2, the processor 1310 would first compare the temperature value of 68 with the low and high temperature thresholds of zone 2 in Table 1. Zone 2 has a low of 61 and a high of 69. Because 68 is within the thresholds for the current zone 2, the processor does not test other zones in the table, and uses the zone 2 data to set the clock regulator speed value equal to 100 and the first intermediate logic value ("X") equal to 8.

If the temperature value 1384 is outside the thresholds for the current zone, the processor 1310 tests the other zones to determine the new zone. Once the new zone has been identified, the processor 1310 will use the data in the new zone and set clock speed regulator value 1392 and the first intermediate logic value. For example, if the temperature value 1384 was 71 degrees Celsius and the current zone is 2, the processor 1310 would first compare the temperature value of 71 with the low and high temperature thresholds of zone 2 in Table 1. Zone 2 has a low of 61 and a high of 69. Because 71 is greater than the high threshold of 69 for the current zone 2, the processor would test in the next greater zone, which for this example is zone 3. Zone 3 has a low of 66 and a high of 73. Because 71 is within the range of zone 3, the processor uses the zone 3 data to set the clock regulator speed value equal to 100 and the first intermediate logic value ("x") equal to 9.

After the hardware control processor 1310 has identified the correct zone and set both the clock speed regulator value 1392 and the first intermediate logic value equal to "x", the processor 1310 transmits the clock speed regulator value 1392 to the control bus 1302.

The hardware control processor 1310 next reads the battery charger status value 1386 from the control bus 1302 and determines if the battery charger 1306 is on or off. If the battery charger 1306 is on (i.e. it is adding to the heat load of the electronic product 1500), the processor then increases the intermediate logic value to increase the speed of the fan to accommodate the increased heat load. If the first intermediate logic value "x" is equal to zero, then the processor 1302 will set the second intermediate logic value to 8. If the first intermediate logic value "x" is greater than zero, the processor will add 2 to "x" and set the second intermediate logic value to "2+x". For example, if the first intermediate logic value "x" is equal to 7 (i.e. from zone 1 of Table 1, above) and the power supply is on, the processor 1310 will add 2 to 7 and then set the second intermediate logic value to equal 9. If the battery charger 1306 is off (i.e. it is not adding to the heat load of the electronic product 1500), then the processor 1310 sets the second intermediate logic value to equal the first intermediate logic value "x".

It is important to note that even when the electronic product has been "turned off" by a human operator, the control bus 1302, the hardware control processor 1310, and the digital pot 1314 remain energized. Therefore, if the electronic product is "off" but the AC to DC power supply/battery charger 1306 has been connected to an external AC power source to recharge one or more batteries within the electronic product, the processor 1310 will detect the change in status (i.e. from off to full power) of the battery charger 1306 and will set the second intermediate logic value to 8 (thereby operating the fan at 50% of the maximum speed, see Table 2 and related discussion, below) to remove the heat generated by the power supply. When the batteries are fully charged and the battery charger 1306 switches from a fast charge to a trickle charge, a pulse charge, or standby, the processor 1310 will detect the change in the battery charger status value 1386 (i.e. from full power to minimum power) and will set the second intermediate logic value to zero, thereby turning the cooling fan 1318 off.

The hardware control processor 1310 next reads the specified device status value 1388 from the control bus 1302 and determines if the specified device 1308 is on or off. If the specified device is on (i.e. the specified device is adding to the heat load of the electronic product 1500), then the processor 1310 will set the third intermediate logic value equal to the second intermediate logic value plus 1. If however, the second intermediate logic value is zero, the processor 1310 will set the third intermediate value to zero. If the specified device 1308 is off (i.e. it is not adding to the heat load of the electronic product 1500), then the processor 1310 will set the third intermediate value equal to the second intermediate value if the second intermediate value is non-zero.

Once the third intermediate value has been calculated, the hardware control processor 1310 will set the fan speed logic value 1394 equal to the third intermediate logic value The processor 1310 then sends the fan speed logic value 1394 to the control bus 1302 where the value is then read by the digital pot 1314.

Referring back to FIG. 13, the digital pot 1314 reads the fan speed logic value 1394, which as discussed above is calculated in a three step calculation by the hardware control processor 1310. The digital pot 1314 uses Table 2 to convert the temperature logic signal into the voltage potential across the output leads of the variable output voltage power supply 1316. Table 2 also shows the steady state speed of the variable speed fan 1318 at the different output voltages potentials of power supply 1316.

TABLE 2

Fan speed logic value - Variable Output Voltage Power Supply - Variable Fan Speed Cross Reference

| Fan speed logic value 1394 read by Digital Pot 1314 (Hexadecimal) | Output Voltage from Variable Output DC Voltage Power Supply 1316 (set by the Digital Pot 1314) | Variable Fan Speed 1318 (percent of maximum fan speed) |
| --- | --- | --- |
| 0 | 0 | Off |
| 7 | 4.9 | 40.0 |
| 8 | 5.6 | 47.5 |
| 9 | 6.3 | 55.0 |
| A | 7.0 | 62.5 |
| B | 7.75 | 70.0 |
| C | 8.5 | 77.5 |
| D | 9.5 | 85.0 |
| E | 10.25 | 92.5 |
| F | 11.2 | 100.0 |

In another aspect of the invention, when the hardware control processor 1310 updates the fan speed logic value 1394 from zero to a non-zero value (i.e. the fan was off and is being cold started), the hardware control processor will set the fan speed logic value equal to "C" for an initial 100 millisecond period, and then immediately thereafter reset the fan speed logic value to the calculated value. Referring to Table 2, above, it can be observed that the hexadecimal value "C" translates to 8.5 volts DC. This is done to start the fan blades turning, but is for such a brief time, the fan is essentially slow starting and therefore will not overspeed or overshot the calculated setpoint speed.

The present invention, therefore, is well adapted to attain the ends and advantages mentioned, as well as others inherent therein. While presently preferred embodiments of the invention and various aspects thereto have been given for purposes of disclosure, numerous changes in the details of construction, interconnection and arrangement of parts will readily suggest themselves to those skilled in the art and which are encompassed within the spirit of the invention and the scope of the appended claims.

While the present invention has been depicted, described, and is defined by reference to particularly preferred embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described preferred embodiments of the invention are exemplary only, and are not exhaustive of the scope of the invention. Consequently, the invention is intended to be limited only by the spirit and scope of the appended claims, giving full cognizance to equivalents in all respects.

What is claimed is:

1. A thermal management controller, the thermal management controller comprising:

a thermal management structure, a temperature sensor, a control bus, a hardware control processor, a variable output voltage power supply, and a variable speed fan;

the thermal management structure having a substrate and two heat sink pieces, the substrate having at least one semiconductor die, the substrate interposed between and thermally connected to the two heat sink pieces;

the temperature sensor thermally connected to one of the two heat sink pieces, the temperature sensor electrically connected to the control bus;

the hardware control processor electrically connected to the control bus;

the variable output voltage power supply, the power supply having electric power output connections and a digital pot, the digital pot electrically connected to the control bus; and the variable speed fan electrically connected to the electric power output connections of the power supply.

2. The thermal management controller according to claim 1, wherein the control bus is a digital bus.

3. The thermal management controller according to claim 1, wherein the control bus is an integrated interconnect control bus.

4. The thermal management controller according to claim 1, wherein the at least one semiconductor having a clock speed regulator, the regulator electrically connected to the control bus.

5. The thermal management controller according to claim 1, wherein the at least one semiconductor die of the thermal management structure is an unpackaged semiconductor die.

6. The thermal management controller according to claim 1, wherein the at least one semiconductor die of the thermal management structure is a packaged semiconductor die.

7. The thermal management controller according to claim 1, wherein the at least one semiconductor die of the thermal management structure is a microprocessor die.

8. The thermal management controller according to claim 1, further comprising:

a battery charger, the battery charger electrically connected to the control bus.

9. The thermal management controller according to claim 1, further comprising:

at least one specified device, the at least one specified device electrically connected to the control bus.

10. The thermal management controller according to claim 9, wherein the at least one specified device is selected from the group consisting of a CD-ROM drive, a hard disk drive, a removable disk drive, and a PCMCIA card.

11. A method of controlling forced convection heat removal from an electronic product, comprising the steps of:

providing a thermal management structure, the thermal management structure having a substrate with at least one semiconductor die, the substrate interposed and thermally connecting to two heat sink pieces;

providing a temperature sensor, a digital bus, a hardware control processor, a variable output voltage power supply, each having digital signal connections;

providing a variable speed fan;

thermally connecting the temperature sensor to the thermal management structure, and connecting the digital connections of the temperature sensor to the digital bus;

connecting the digital connections of the hardware control processor to the digital bus;

connecting the digital connections of the variable output voltage power supply to the digital bus, the variable output voltage power supply having electric power output connections; and electrically connecting the variable speed fan to the electric power output connections of the power supply.

12. The method of claim 11, further comprising the steps of:

the temperature sensor transmitting a temperature value to the digital bus;

the hardware control processor receiving the temperature value from the digital bus;

the hardware control processor calculating a fan speed logic value corresponding to the temperature value;

the hardware control processor sending the fan speed logic value to the digital bus;

the variable output voltage power supply receiving the fan speed logic value from the digital bus;

the variable output voltage power supply adjusting the output voltage across the electric power output connections; and the variable speed fan changing speed.

13. The method of claim 11, further comprising the steps of:

providing a clock speed regulator for regulating the clock speed of the at least one semiconductor die, the clock speed regulator having digital connections; and connecting the digital connections of the clock speed regulator to the digital bus.

14. The method of claim 13, further comprising the steps of:

the temperature sensor transmitting a temperature value to the digital bus;

the hardware control processor receiving the temperature value from the digital bus;

the hardware control processor calculating a fan speed logic value corresponding to the temperature value;

the hardware control processor calculating a clock speed value corresponding to the temperature value;

the hardware control processor sending the fan speed logic value and the clock speed value to the digital bus;

the clock speed regulator receiving the clock speed value from the digital bus;

the clock speed regulator adjusting the clock speed of the at least one semiconductor die;

the variable output voltage power supply receiving the fan speed logic value from the digital bus;

the variable output voltage power supply adjusting the output voltage across the electric power output connections; and the variable speed fan changing speed.

15. The method of claim 11, further comprising the steps of:

providing a battery charger having digital connections; and connecting the digital connections of the battery charger to the digital bus.

16. The method of claim 15, further comprising the steps of:

the temperature sensor transmitting a temperature value to the digital bus;

The battery charger sending a status value to the digital bus;

the hardware control processor receiving the temperature value from the digital bus;

the hardware control processor calculating a first fan speed logic value corresponding to the temperature value;

the hardware control processor receiving the status value from the digital bus;

the hardware control processor calculating a second fan speed logic value corresponding to the status value;

the hardware control processor sending the second fan speed logic value to the digital bus;

the variable output voltage power supply receiving the second fan speed logic value from the digital bus;

the variable output voltage power supply adjusting the output voltage across the electric power output connections; and the variable speed fan changing speed.

17. The method of claim 11, further comprising the steps of:
   providing a specified device having digital connections; and
   connecting the digital connections of the specified device to the digital bus.

18. The method of claim 17, further comprising the steps of:
   the temperature sensor transmitting a temperature value to the digital bus;
   The specified device sending a status value to the digital bus;
   the hardware control processor receiving the temperature value from the digital bus;
   the hardware control processor calculating a first fan speed logic value corresponding to the temperature value;
   the hardware control processor receiving the status value from the digital bus;
   the hardware control processor calculating a second fan speed logic value corresponding to the status value;
   the hardware control processor sending the second fan speed logic value to the digital bus;
   the variable output voltage power supply receiving the second fan speed logic value from the digital bus;
   the variable output voltage power supply adjusting the output voltage across the electric power output connections; and
   the variable speed fan changing speed.

19. An electronic system for thermal management, the electronic system comprising:
   a thermal management structure, a temperature sensor, a control bus, a hardware control processor, a variable output voltage power supply, and a variable speed fan;
   the thermal management structure having a substrate and two heat sink pieces, the substrate having at least one semiconductor die, the substrate interposed between and thermally connected to the two heat sink pieces;
   the temperature sensor thermally connected to one of the two heat sink pieces, the temperature sensor electrically connected to the control bus;
   the hardware control processor electrically connected to the control bus;
   the variable output voltage power supply, the power supply having electric power output connections and a digital pot, the digital pot electrically connected to the control bus;
   the variable speed fan electrically connected to the electric power output connections of the power supply, thereby forming a thermal management controller; and
   an electronic system having a plurality of electrical terminals, signal terminals and a chassis, the plurality of electrical terminals interconnected to the substrate, the plurality of signal terminals interconnected to the substrate, and the chassis containing the thermal management controller.

20. The electronic system according to claim 19, wherein the control bus is a digital bus.

21. The electronic system according to claim 19, wherein the control bus is an integrated interconnect control bus.

22. The electronic system according to claim 19, wherein the at least one semiconductor having a clock speed regulator, the regulator electrically connected to the control bus.

23. The electronic system according to claim 19, wherein the at least one semiconductor die of the thermal management structure is an unpackaged semiconductor die.

24. The electronic system according to claim 19, wherein the at least one semiconductor die of the thermal management structure is a packaged semiconductor die.

25. The electronic system according to claim 19, wherein the at least one semiconductor die of the thermal management structure is a microprocessor die.

26. The electronic system according to claim 19, further comprising:
   a battery charger, the battery charger electrically connected to the control bus.

27. The electronic system according to claim 19, further comprising:
   at least one specified device, the at least one specified device electrically connected to the control bus.

28. The electronic system according to claim 19, wherein the at least one specified device is selected from the group consisting of a CD-ROM drive, a hard disk drive, a removable disk drive, and a PCMCIA card.

29. The electronic system of claim 19, wherein the electronic system is a lap top computer.

30. The electronic system of claim 19, wherein the electronic system is a notebook computer.

31. The electronic system of claim 19, wherein the electronic system is a sub-notebook computer.

32. The electronic system of claim 19, wherein the electronic system is a desktop computer.

33. The electronic system of claim 19, wherein the electronic system is a printer.

34. The electronic system of claim 19, wherein the electronic system is a scanner.

35. A computer system for thermal management, the computer system comprising:
   a thermal management structure, a temperature sensor, a control bus, a hardware control processor, a variable output voltage power supply, and a variable speed fan;
   the thermal management structure having a substrate and two heat sink pieces, the substrate having a microprocessor die, the substrate interposed between and thermally connected to the two heat sink pieces;
   the temperature sensor thermally connected to one of the two heat sink pieces, the temperature sensor electrically connected to the control bus;
   the hardware control processor electrically connected to the control bus;
   the variable output voltage power supply, the power supply having electric power output connections and a digital pot, the digital pot electrically connected to the control bus;
   the variable speed fan electrically connected to the electric power output connections of the power supply, thereby forming a thermal management controller; and
   a computer system having a plurality of electrical terminals, signal terminals and a chassis, the plurality of electrical terminals interconnected to the substrate, the plurality of signal terminals interconnected to the substrate, and the chassis containing the thermal management controller.

* * * * *